(12) United States Patent
Duan et al.

(10) Patent No.: US 12,022,608 B2
(45) Date of Patent: Jun. 25, 2024

(54) RADIO FREQUENCY CROSSOVER WITH HIGH ISOLATION IN MICROELECTRONICS H-FRAME DEVICE

(71) Applicant: Northrop Grumman Systems Corporation, Falls Church, VA (US)

(72) Inventors: Dah-Weih Duan, Torrance, CA (US); Elizabeth T. Kunkee, Manhattan Beach, CA (US); Martin E. Roden, Long Beach, CA (US); Laura M. Woo, Rossmoor, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 726 days.

(21) Appl. No.: 17/219,103

(22) Filed: Mar. 31, 2021

(65) Prior Publication Data
US 2022/0295629 A1    Sep. 15, 2022

Related U.S. Application Data

(63) Continuation-in-part of application No. 17/198,700, filed on Mar. 11, 2021.

(51) Int. Cl.
*H05K 1/02* (2006.01)
*H01L 23/04* (2006.01)
(Continued)

(52) U.S. Cl.
CPC .......... *H05K 1/0237* (2013.01); *H01L 23/04* (2013.01); *H01L 23/5221* (2013.01);
(Continued)

(58) Field of Classification Search
CPC ............................ H05K 1/0224; H05K 1/0237
See application file for complete search history.

(56) References Cited

U.S. PATENT DOCUMENTS

| | | |
|---|---|---|
| 5,319,329 A | 6/1994 | Shiau et al. |
| 6,128,195 A | 10/2000 | Weber et al. |
| (Continued) | | |

FOREIGN PATENT DOCUMENTS

| | | |
|---|---|---|
| CN | 101420056 | 4/2009 |
| CN | 102354783 | 2/2012 |
| (Continued) | | |

OTHER PUBLICATIONS

International Preliminary Report on Patentability in related Application Serial No. PCT/US2021/031224, issued on Jan. 26, 2023, 10 pages.

(Continued)

*Primary Examiner* — Jeremy C Norris
(74) *Attorney, Agent, or Firm* — KLINTWORTH & ROZENBLAT IP LLP

(57) ABSTRACT

A microelectronics H-frame device comprising an RF crossover includes: a stack of two or more substrates, wherein a bottom surface of a top substrate comprises top substrate bottom metallization, and wherein a top surface of a bottom substrate comprises bottom substrate top metallization, wherein the top substrate bottom metallization and the bottom substrate top metallization form a ground plane that provides isolation to allow a first signal line to traverse one or more of the top substrate and the bottom substrate without being disturbed by a second signal line traversing one or more of the top substrate and the bottom substrate at a non-zero angle relative to the first signal line, at least one of the first signal line and the second signal line passing to a second level with the protection of the ground plane, thereby providing isolation from the other signal line.

15 Claims, 11 Drawing Sheets

(51) Int. Cl.
    *H01L 23/522* (2006.01)
    *H01L 23/528* (2006.01)
    *H01L 23/66* (2006.01)
    *H01P 3/08* (2006.01)

(52) U.S. Cl.
    CPC ........ *H01L 23/5226* (2013.01); *H01L 23/528* (2013.01); *H01L 23/66* (2013.01); *H01P 3/08* (2013.01)

(56) References Cited

U.S. PATENT DOCUMENTS

| | | | |
|---|---|---|---|
| 6,522,214 | B1 | 2/2003 | Harju et al. |
| 6,734,750 | B1 | 5/2004 | Ostergaard |
| 9,627,736 | B1 | 4/2017 | Ingalls |
| 9,761,547 | B1 | 9/2017 | Kunkee et al. |
| 9,865,909 | B2 | 1/2018 | Chan |
| 10,153,222 | B2 | 12/2018 | Yu et al. |
| 11,470,695 | B2 | 10/2022 | Kunkee et al. |
| 2003/0206261 | A1 | 6/2003 | Cahill |
| 2007/0048898 | A1 | 3/2007 | Carlson et al. |
| 2008/0001241 | A1 | 1/2008 | Tuckerman et al. |
| 2008/0002460 | A1 | 1/2008 | Tuckerman et al. |
| 2010/0148293 | A1 | 6/2010 | Jain et al. |
| 2012/0094442 | A1 | 4/2012 | Lin et al. |
| 2016/0030965 | A1 | 4/2016 | Lin |
| 2018/0352651 | A1 | 12/2018 | Tazzoli et al. |
| 2019/0081380 | A1 | 3/2019 | Bates |
| 2020/0091608 | A1 | 3/2020 | Alpman et al. |
| 2020/0075503 | A1 | 5/2020 | Chuang et al. |

FOREIGN PATENT DOCUMENTS

| | | |
|---|---|---|
| CN | 108074872 | 4/2018 |
| CN | 108598638 | 9/2018 |
| WO | WO 2007-103224 | 9/2007 |
| WO | WO 2016133457 | 8/2016 |

OTHER PUBLICATIONS

International Search Report in related Application Serial No. PCT/US2021/031224, issued on Jul. 19, 2021, 27 pages.
Hsieh et al., Design of Ku-Band SIR Interdigital Bandpass Filter Using Silicon-Based Micromachining Technology, Silicon Monolithic Integrated Circuits in RF Systems (SIRF), 2010 Topical Meeting On, IEEE, Jan. 11, 2010, pp. 104-107.
Mokhtaari et al., Ultra-wideband and notched wideband filters with grounded vias in microstrip technology, Microwave Conference, 2008. AMPC 20008. Asia-Pacific, IEEE, Dec. 16, 2008, pp. 1-4.
Stephen V. Robertson et al., Micromachined Self-Packaged W-Bandpass Filters, IEEE MTT-S International Microwave Symposium Digest. Orlando, May 16-20, 1995; IEEE MTT-S International Microwave Symposium Digest, May 16, 1995, vol. 3, pp. 1543-1546.
International Search Report in related Application Serial No. PCT/US2021/015211, issued on Apr. 20, 2021, 28 pages.
Invitation To Pay Additional Fees in related Application Serial No. PCT/US2022/015204. issued on May 23, 2022, 16 pages.
International Search Report in related Application Serial No. PCT/US2022/016263, issued on Jul. 22, 2022, 20 pages.
International Search Report in related Application Serial No. PCT/US2022/015205, issued on Jul. 14, 2022, 22 pages.
Elizabeth T. Kunkee, D. Duan, A. Sulian, P. Ngo, N. Lin, C. Zhang, D. Ferizovic, C. M. Jackson, and R. Lai, "Suspended SiC Filter with DRIE Silicon Subcover," IEEE International Microwave Symposium, Paper We32-293, Jun. 21, 2020. IEEE-MTT Industry Paper Finalist; pp. 1051-1054.
Song Lin, Development of an Ultra-Wideband Suspended Stripline to Shielded Microstrip Transition, IEEE Microwave and Wireless Components Letters, vol. 21, No. 9, Sep. 2011, pp. 474-476.
Young-Gon Kim and Kang Wook Kim, A New Design Method for Ultra-Wideband Microstrip-to-Suspended Stripline Transitions, Machine Copy for Proofreading, vol. x, y-z, 2013, pp. 1-14.
Dr. Burhan Bayraktaroglu, Heterogeneous Integration Technology, Final Report, Aug. 2017, 108 pages.
Yuan Li, Pete L. Kirby, and John Papapolymerou, Silicon Micromachined W-Band Bandpass Filter Using DRIE Technique, Proceedings of the 36th European Microwave Conference, Sep. 2006, Manchester UK, pp. 1271-1273.
John C. Tippet and Ming J. Shiau, Circuit Transformations for Realization of a Class of Miniature Printed Circuit Filters, IEEE MTT-S Digest, 1994, pp. 621-624.
Mingqi Chen, A 1-25 GHz GaN HEMT MMIC Low-Noise Amplifier, IEEE Microwave and Wireless Components Letters, vol. 20, No. 10, Oct. 2010, pp. 563-565.
Yemin Tang, et al., Ultra Deep Reactive Ion Etching of High Aspect-Ratio and Thick Silicon Using a Ramped-Parameter Process, Journal of Microelectromechanical Systems, vol. 27, No. 4, Aug. 2018, pp. 686-697.
Vesna Radisic, et al., Heterogeneously Integrated V-Band Amplifier, IEEE/MTT-S International Microwave Symposium, 2018, pp. 289-292.
Wolfgang Menzel, Quasi-Lumped Suspended Stripline Filters and Diplexers, IEEE Transactions on Microwave Theory and Techniques, vol. 53, No. 10, Oct. 2005, pp. 3230-3237.
Kenjiro Nishikawa, et al., Compact 60-GHz LTCC Stripline Parallel-coupled Bandpass Filter with Parasitic Elements for Millimeter-wave System-on-Package, NTT Network Innovation Laboratories, NTT Corporation, Japan, IEEE, 2007, pp. 1649-1652.
Jian-Xing Zhuang, Silicon Micromachined Terahertz Bandpass Filter With Elliptic Cavities, IEEE Transactions on Terahertz Science and Technology, vol. 5, No. 6, Nov. 2015, pp. 1040-1047.
Jiunnjye Tsaur, et al, A Ground Shielded Low Loss TRANSMISSI163-166ON Line Using Au-to-Au Thermo Compressive Packaging for RF Applications, IEEE, 2005, pp. 163-166.
Soon Young Eom et al., Compact Broadband Microstrip Crossover With Isolation Improvement and Phase Compensation, IEEE Microwave and Wireless Components Letters, vol. 24, No. 7, Jul. 2014, pp. 481-483.
Jeong-Geun Kim et al., Miniature Four-Way and Two-Way 24 GHz Wilkinson Power Dividers in 0.13 µm CMOS, IEEE Microwave and Wireless Components Letters, vol. 17, No. 9, Sep. 2007, pp. 658-660.
Adel A. M. Saleh, Planar Electrically Symmetric n-Way Hybrid Power Dividers/Combiners, IEEE Transactions on Microwave Theory and Techniques, vol. MTT-28, No. 6, Jun. 1980, pp. 555-563.
Soumendu Sinha, et al., Design and Optimization of RF MEMS T-Type Switch for Redundancy Switch Matrix Applications, 2012 International Conference on Computing, Electronics and Electrical Technologies [ICCEET], 2012, pp. 501-508.
Yana Taryana et al., Four Way Power Divider Using Wilkinson Method for X-Band Radar, 2019 International Conference on Radar, Antenna, Microwave, Electronics, and Telecommunications, 2019, pp. 41-45.
Ernest J. Wilkinson, An N-Way Hybrid Power Divider, Ire Transactions on Microwave Theory and Techniques, Jan. 1960, pp. 116-118.
Liu Xin et al., A Novel Compact Planar Crossover With Simple Design Procedure, Proceedings of Asia-Pacific Microwave Conference 2010, pp. 1633-1636.

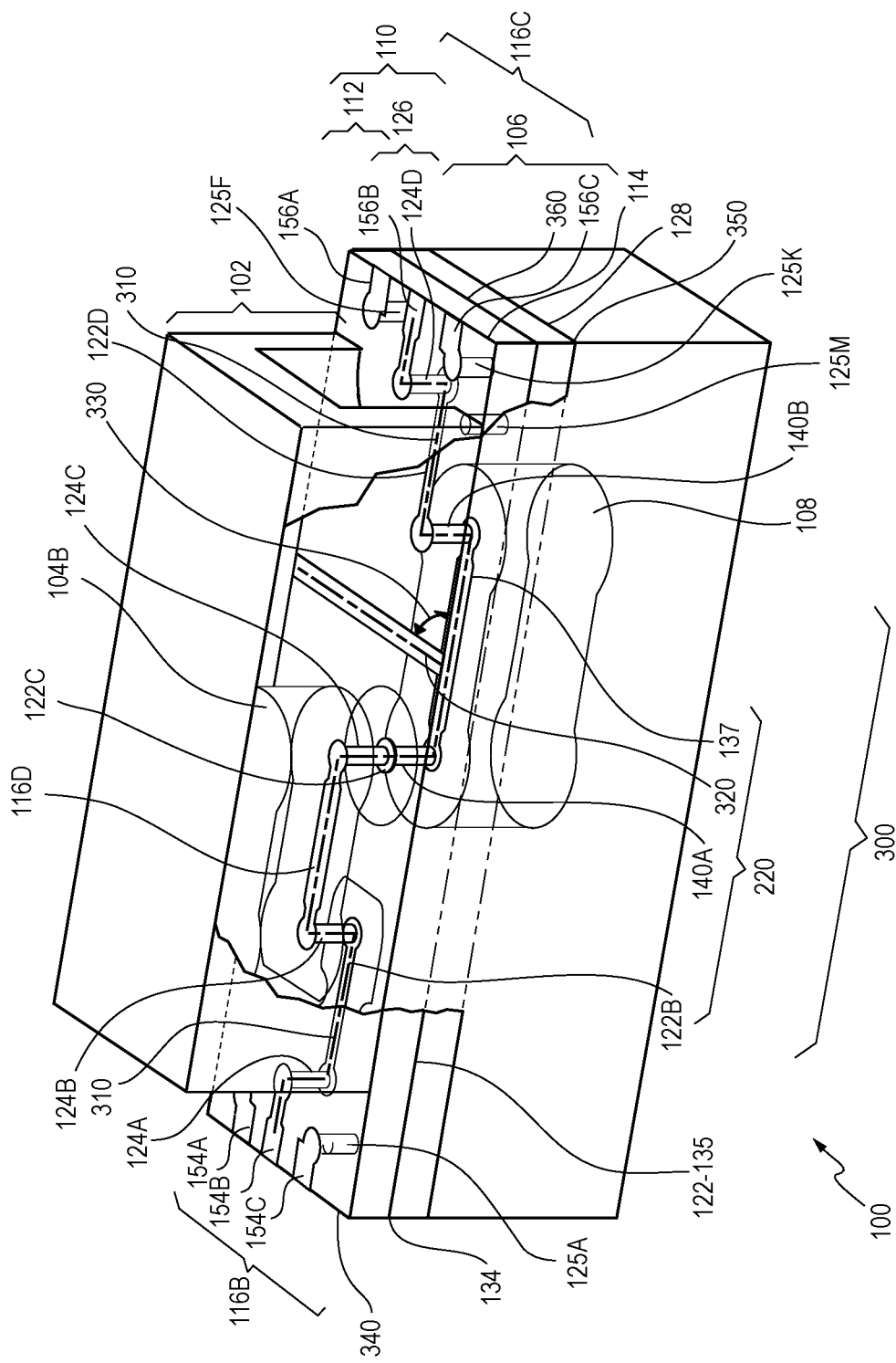

RADIO FREQUENCY CROSSOVER WITH HIGH ISOLATION IN MICROELECTRONICS H-FRAME DEVICE

CROSS-REFERENCE TO RELATED APPLICATIONS

The present application is a continuation-in-part application of U.S. patent application Ser. No. 17/198,700, filed Mar. 11, 2021, entitled "MICROELECTRONICS H-FRAME DEVICE", the entire contents of which is incorporated herein by reference.

This application also contains subject matter that is related to the subject matter of the following applications, which are assigned to the same assignee as this application. The below-listed applications are hereby incorporated herein by reference in its entirety:

"FILTER WITH AN ENCLOSURE HAVING A MICRO-MACHINED INTERIOR USING SEMICONDUCTOR FABRICATION," by Kunkee, et al., filed on Apr. 28, 2020, Ser. No. 16/860,642.

"CHANNELIZED FILTER USING SEMICONDUCTOR FABRICATION," by Duan, et al., filed on Jun. 30, 2020, Ser. No. 16/916,644.

STATEMENT OF GOVERNMENT RIGHTS

The Government of the United States of America has rights in this invention pursuant to Government Contract No. 17-C-3186.

SUMMARY

A microelectronics H-frame device comprising a radio frequency (RF) crossover comprises a stack of two or more substrates with a micro-machined top cover attached to a top side of the device and a micro-machined bottom cover attached to a bottom side of the device, forming an "H-frame" package entirely fabricated with microelectronics technologies. "H-frame" refers to a double-sided metal housing where electronics are packaged to form a "module." Specifically the letter "H" refers to the shape of a vertical cross section of the housing. The horizontal bar in "H" refers to the "center web" or the common, shared floor for component attachment. Substrate transmission lines, printed circuit boards and other electronic components are attached to both the top side and bottom side of the center web. The vertical bars in "H" refers to the surrounding vertical walls of the housing. The H-frame device is described in more detail in the application entitled MICROELECTRONICS H-FRAME DEVICE by Duan, et al., filed on Mar. 11, 2021, Ser. No. 17/198,700.

Geometry of the top and bottom chips may be different. The upper and lower chips, even if different, may be fabricated on the same wafer. A top surface of the top chip and a bottom surface of the bottom chip are fabricated together on a front of the wafer. When the wafer is diced into chips, an upper chip and a lower chip can be bonded together. Using a first dedicated wafer for the upper chip and using a second dedicated wafer for the lower chip is also possible when a number of desired chips is large, for example, when the number of desired chips is larger than approximately ten.

Embodiments of the invention provide a compact vertical feed-through transition allowing a spiral inductor to "escape" a sealed cavity.

Metallization in the top cover and the bottom cover, and through-substrate vias comprised in the substrates together form a continuous metal shielding, or "walls" for the package. Mid-substrate metallization (a "middle" metal layer) comprising one or more of top substrate bottom metallization and bottom substrate top metallization is sandwiched between the two substrates in the new H-frame, creating a ground plane. The ground plane can provide isolation to a first signal line and a second signal line crossing in the microelectronics H-frame device comprising a radio frequency (RF) crossover. A grounding structure of the device comprises a substrate grounding structure. The substrate grounding structure comprises at least one of the top substrate top metallization, the bottom substrate bottom metallization, a top substrate bottom metallization, a bottom substrate top metallization, and through-substrate vias providing an electrical connection from the top substrate top metallization to the bottom substrate bottom metallization. Bumps join these two metallizations together through the bonding process. Passive circuits such as filters, power splitters, couplers, etc. can be directly patterned on the top side of a substrate. Similarly, pads can be directly patterned on the top side of the substrate. The pads are usable for attaching discrete circuits such as monolithic microwave integrated circuits (MMICs), capacitors, and the like. A radio frequency (RF) transmission line may comprise one or more of a microstrip, a coplanar waveguide (CPW), and a stripline. The RF transmission line can travel on a top side of either substrate or even in the thin "center web" layer, i.e. a "middle" metal layer. The RF transmission line can switch layers. The RF transmission line can transition to a different line type with fully integrated transitions comprising one or more of through-substrate vias, patterned metallization on the substrates, and vertical walls comprised in the covers.

An alcove created in one of the covers, positioned at the electrical input and output of the H-frame, has metallized walls, helps gradually transforming the direction of the electric field from being vertical (in the microstrip line) to horizontal (in the so called "vertical coaxial cable" formed by the signal via and its surrounding ground vias). This helps achieving good return loss as well as containing the radiation leakage, resulting in a transition design with sound RF integrity.

An alcove is part of an outer wall of a cover that is used to create an escape transition. The alcove is contoured to facilitate a good RF transition. The alcove does not break the wall or introduce a hole in the outer wall, and hence maintains the environmental seal provided by the outer wall of a cover.

The alcove, with its metallized wall, helps gradually transforming the direction of the electric field from being vertical (in the microstrip line) to horizontal (in the so called "vertical coaxial cable" formed by the signal via and its surrounding ground vias). This helps achieving good return loss as well as containing the radiation leakage, resulting in a transition design with sound RF integrity.

An alcove in an escape transition is part of an outer wall of a cover. The alcove is contoured to facilitate a good RF transition. The alcove does not break the wall or introduce a hole in the outer wall, and hence maintains the environmental seal provided by the outer wall of a cover.

A microelectronics high isolation H-frame device comprising a radio frequency (RF) crossover includes: a stack of two or more substrates, wherein the substrate stack comprises a top substrate and a bottom substrate, wherein at least one of the top substrate and the bottom substrate comprises at least one of a transmission line, a circuit board, a filter, a power splitter, a coupler, and another electronic component, wherein bonding of the top substrate to the bottom substrate creates an electrical connection between the top substrate and the bottom substrate, wherein a bottom surface of the top substrate comprises top substrate bottom metallization, and wherein a top surface of the bottom substrate comprises bottom substrate top metallization, wherein the top substrate bottom metallization and the bottom substrate top metallization form a ground plane configured to provide isolation to allow a first signal line to traverse one or more of the top substrate and the bottom substrate without being disturbed by a second signal line traversing one or more of the top substrate and the bottom substrate at a non-zero angle relative to the first signal line, at least one of the first signal line and the second signal line passing to a second level with the protection of the ground plane, thereby providing isolation from the other signal line.

A microelectronics high isolation H-frame device comprising a radio frequency (RF) crossover includes: a stack of two or more substrates, wherein the substrate stack comprises a top substrate and a bottom substrate, wherein at least one of the top substrate and the bottom substrate comprises at least one of a transmission line, a circuit board, a filter, a power splitter, a coupler, and another electronic component, wherein bonding of the top substrate to the bottom substrate creates an electrical connection between the top substrate and the bottom substrate, wherein a bottom surface of the top substrate comprises top substrate bottom metallization, and wherein a top surface of the bottom substrate comprises bottom substrate top metallization, wherein the top substrate bottom metallization and the bottom substrate top metallization form a ground plane configured to provide isolation to allow a first signal line to traverse one or more of the top substrate and the bottom substrate without being disturbed by a second signal line traversing one or more of the top substrate and the bottom substrate at a non-zero angle relative to the first signal line, at least one of the first signal line and the second signal line passing to a second level with the protection of the ground plane, thereby providing isolation from the other signal line, wherein the at least one of the first signal line and the second signal line passes from the second level to a third level with the protection of the ground plane, thereby providing isolation from the other signal line, the device further comprising a grounding structure configured to ground the device, wherein the grounding structure comprises a substrate grounding structure, wherein the substrate grounding structure comprises at least one of the top substrate top metallization, the bottom substrate bottom metallization, a top substrate bottom metallization, a bottom substrate top metallization, and through-substrate vias providing an electrical connection from the top substrate top metallization to the bottom substrate bottom metallization.

DESCRIPTION OF THE DRAWINGS

The accompanying drawings provide visual representations which will be used to more fully describe various representative embodiments and can be used by those skilled in the art to better understand the representative embodiments disclosed herein and their inherent advantages. In these drawings, like reference numerals identify corresponding elements.

FIGS. 3A-3B is a set of two drawings showing views of a radio frequency (RF) crossover in the H-frame device.

DETAILED DESCRIPTION

FIGS. 1A-1H are a set of eight drawings of a microelectronics H-Frame device.

Figure 1A:
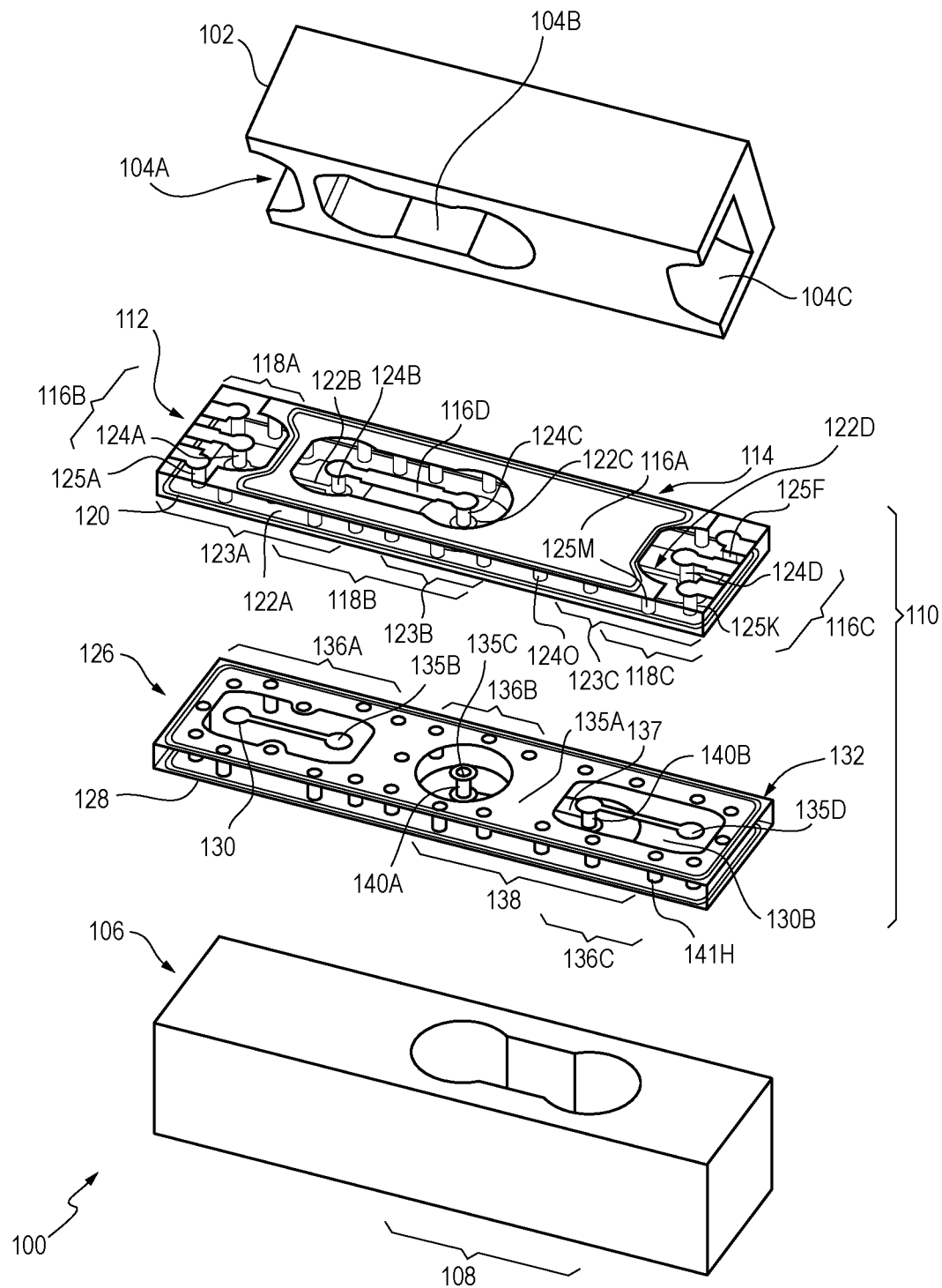
FIGS. 1A-1H are a set of eight drawings of a microelectronics H-Frame device.

FIG. 1A shows an exploded view of a microelectronics H-frame device 100.

The microelectronics H-frame device 100 comprises a top cover 102. For example, the top cover 102 comprises a semiconductor.

For example, and as depicted, the top cover 102 comprises three top cover cavities 104A-104C, a first top cover cavity 104A, a second top cover cavity 104B, and a third top cover cavity 104C. The first top cover cavity 104A comprises a partial first top cover cavity 104A. The second top cover cavity 104B comprises a fully formed second top cover cavity 104B. The third top cover cavity 104C comprises a partial third top cover cavity 104C.

For example, as discussed below in further detail, the top cover 102 is micro-machined to form one or more of the top cover cavities 104A-104C. For example, as discussed below in further detail, the top cover 102 is plated to form one or more of the top cover cavities 104A-104C. For example, the top cover 102 is plated using gold to form one or more of the top cover cavities 104A-104C.

The microelectronics H-frame device 100 further comprises a bottom cover 106. For example, the bottom cover 106 comprises a semiconductor. The bottom cover 106 comprises one or more bottom cover cavities 108. For example, and as depicted, the bottom cover 106 comprises one bottom cover cavity 108. For example, as discussed below in further detail, the bottom cover 106 is micro-machined to form the bottom cover cavity 108. For example, as discussed below in further detail, the bottom cover 106 is plated to form the bottom cover cavity 108. For example, the bottom cover 106 is plated using gold to form the bottom cover cavity 108.

The microelectronics H-frame device 100 further comprises a substrate 110. Preferably, but not necessarily, the substrate 110 comprises a substantially planar substrate 110. Preferably, but not necessarily, the substrate 110 is configured to be encapsulated between the bottom cover 106 and the top cover 102. For example, the substrate 110 has a thickness between approximately 200 microns and approximately 800 microns.

The substrate 110 comprises a top substrate 112. Preferably, but not necessarily, the top substrate 112 comprises silicon carbide (SiC).

The top substrate 112 is operably connected to the top cover 102. Preferably, the top substrate 12 is bonded to the top cover 102. The top substrate 112 comprises a top substrate top surface 114. Preferably, but not necessarily, the top substrate top surface 114 comprises circuit components of the H-frame device 100 such as, for example, one or more of transistors, resistors, capacitors, and transmission lines.

Preferably, but not necessarily, the top substrate top surface 114 comprises a first bonding interface 114 at which the top substrate 112 is physically bonded to the top cover 102. Preferably, but not necessarily, the top substrate 112 is physically bonded to the top cover 102. For example, the top substrate 112 is physically bonded to the top cover 102 at the top substrate top surface 114. For example, gold-gold compression bonding is used to physically attach the top substrate 112 to the top cover 102 at the top substrate top surface 114. For example, a first adhesive (not shown in FIG. 1A)

physically attaches the top substrate 112 to the top cover 102 at the top substrate top surface 114. For example, the first adhesive comprises epoxy. For example, the first adhesive comprises electrically conductive epoxy. For example, the first adhesive comprises gold which can be compression bonded to gold on the top cover 102.

Preferably, but not necessarily, the top substrate top surface 114 is configured to support a top substrate top metallization 116. For example, the top substrate top metallization 116 has a thickness between approximately 1 micron and approximately 13 microns. For example, the top substrate top metallization 116 has a thickness of approximately 3.5 microns. For example, the top substrate top metallization 116 has a thickness of approximately 5.5 microns. The top substrate top metallization 116 comprises a top substrate top ground plane 116A that is used as one or more of a reference conductor and a "ground conductor in the H-frame device 100. The top substrate top metallization 116B comprises a first input/output port 116B, discussed in more detail below in FIG. 1C. The top substrate top metallization 116C comprises a second input/output port 116C, also discussed in more detail below in FIG. 1C. The top substrate top metallization 116D comprises a first top substrate top signal line 116D configured to conduct a signal.

The top substrate top metallization 116 comprises one or more top substrate top metallization openings 118A-118C. For example, and as depicted, the top substrate top metallization 116 comprises three top substrate top metallization openings 118A-118C, a first top substrate top metallization opening 118A, a second top substrate top metallization opening 118B, and a third top substrate top metallization opening 118C. The first top substrate top metallization opening 118A comprises a partial first top substrate top metallization opening 118A. The second top substrate top metallization opening 118B comprises a fully formed second top substrate top metallization opening 118B. The third top substrate top metallization opening 118C comprises a partial third top substrate top metallization opening 118C.

As described below in more detail, the first top substrate top metallization opening 118A is designed so as to approximately align with the first top cover cavity 104A. Similarly, as described below in more detail, the second top substrate top metallization opening 118B is designed so as to approximately align with the second top cover cavity 104B. As described below in more detail, the third top substrate metallization opening 118C is designed so as to approximately align with the third top cover cavity 104C.

The top substrate 112 further comprises a top substrate bottom surface 120. The top substrate bottom surface 120 comprises a top substrate bottom ground plane 122A that is used as one or more of a reference conductor and a ground conductor in the H-frame device 100.

Preferably, but not necessarily, the top substrate bottom surface 120 is configured to support a top substrate bottom metallization 122. For example, the top substrate bottom metallization 122 has a thickness between approximately 1 micron and approximately 13 microns. For example, the top substrate bottom metallization 122 has a thickness of approximately 3.5 microns. For example, the top substrate bottom metallization 122 has a thickness of approximately 5.5 microns. The top substrate bottom metallization 122 comprises the top substrate bottom ground plane 122A, a first top substrate bottom signal line 122B, a circular top substrate bottom metallization via pad 122C, and a second top substrate bottom signal line 122D. These three top substrate bottom metallizations 122B, 122C, and 122D are described in more detail in FIGS. 2A and 2B.

The top substrate bottom metallization 122 comprises one or more top substrate bottom metallization openings 123A-123C. For example, and as depicted, the top substrate bottom metallization 122 comprises three top substrate bottom metallization openings 123A-123C, a first top substrate bottom metallization opening 123A, a second top substrate bottom metallization opening 123B, and a third top substrate bottom metallization opening 123C.

The top substrate 112 further comprises a plurality of metallized top substrate through-substrate signal vias 124A-124D, the top substrate through-substrate signal vias 124A-124D configured to provide a vertical electrical connection between the top substrate top metallization 116 and the top substrate bottom metallization 122. Bonding of the top cover 102 to the top substrate 112 creates a vertical electrical connection between the top substrate 112 and the top cover 102.

As described below in more detail, the top substrate through-substrate signal vias 124A-124D are preferably hermetically sealed, electrical feed-through vias. The top substrate through-substrate signal vias 124A-124D are preferably formed, as described below in more detail, by etching through the top substrate 112 and plating an interior wall of a void produced by the etching. A top surface of at least one of the top substrate through-substrate signal vias 124A-124D is preferably sealed. For example, a top surface of all of the top substrate through-substrate signal vias 124A-124D is preferably sealed using gold. For example, a top surface of all of the top substrate through-substrate signal vias 124A-124D is preferably sealed using gold. The top substrate signal vias 124A-124D are configured to provide high isolation while conducting an electronic signal from the top substrate bottom metallization 122 to the top substrate top metallization 116.

For example, a top surface of at least one of the top substrate through-substrate signal vias 124A-124D is preferably sealed using a solid cap comprising gold. The top substrate through-substrate signal vias 124A-124D comprise a first top substrate through-substrate signal via 124A, a second top substrate through-substrate signal via 124B, a third top substrate through-substrate signal via 124C, and a fourth top substrate through-substrate signal via 124D. As described below in more detail, the top substrate through-substrate signal vias 124A-124D are preferably hermetically sealed, electrical feed-through vias. The top substrate through-substrate signal vias 124A-124D are preferably formed, as described below in more detail, by etching through the top substrate 112 and plating an interior wall of a void produced by the etching. A top surface of at least one of the top substrate through-substrate signal vias 124A-124D is preferably sealed. For example, a top surface of at least one of the top substrate through-substrate signal vias 124A-124D is preferably sealed using gold. Functions of the second top substrate through-substrate signal via 124B and the third top substrate through-substrate signal via 124E are described in more detail in FIGS. 2A and 2B.

The top substrate 112 further comprises a plurality of top substrate ground vias 125A-125O, the top substrate ground vias 125A-125O configured to provide electrical grounding. The top substrate ground vias 125A-125O comprise a first top substrate ground via 125A, a second top substrate ground via 125F, and a third top substrate ground via 125K. Functions of the first top substrate ground via 125A, the second top substrate ground via 125F, the third top substrate ground via 125K, and the fourth top substrate ground via 125M are described in more detail in FIGS. 1C, 1D, 1E, and 2.

The substrate 110 further comprises a bottom substrate 126. Accordingly, the substrate 110 comprises a stack of the top substrate 112 and the bottom substrate 126. More generally, the substrate 110 comprises a stack of two or more substrates. The device 100 further comprises metallization located between the top substrate 112 and the bottom substrate 126.

Preferably, but not necessarily, the bottom substrate 126 comprises silicon carbide (SiC).

The bottom substrate 126 is operably connected to the bottom cover 106. Preferably, the bottom substrate 126 is bonded to the bottom cover 106. The bottom substrate 126 comprises a bottom substrate bottom surface 128. Preferably, but not necessarily, the bottom substrate bottom surface 128 comprises circuit components of the H-frame device 100 such as, for example, one or more of transistors, capacitors, and transmission lines. Preferably, but not necessarily, the bottom substrate bottom surface 128 comprises a second bonding interface 128 at which the bottom substrate 126 is physically bonded to the bottom cover 106. Preferably, but not necessarily, the bottom substrate 126 is physically bonded to the bottom cover 106. For example, the bottom substrate 126 is physically bonded to the bottom cover 106 at the bottom substrate bottom surface 128. For example, gold-gold pressuring bonding is used to physically attach the top substrate 112 to the bottom cover 106 at the bottom substrate bottom surface 128. For example, a second adhesive (not shown in FIG. 1A) physically attaches the bottom substrate 126 to the bottom cover 106 at the bottom substrate bottom surface 128. For example, the second adhesive comprises epoxy.

Preferably, but not necessarily, the bottom substrate bottom surface 128 is configured to support a bottom substrate bottom metallization 130. For example, the bottom substrate bottom metallization 130 has a thickness between approximately 1 micron and approximately 13 microns. For example, the bottom substrate bottom metallization 130 has a thickness of approximately 3.5 microns. For example, the bottom substrate bottom metallization 130 has a thickness of approximately 5.5 microns.

The bottom substrate 126 further comprises a bottom substrate top surface 132. The bottom substrate top surface 132 is bonded to the top substrate bottom surface 120. As described below in more detail, the bottom substrate top surface 132 is bonded to the top substrate bottom surface 120 using a plurality of bonding bumps comprised in both the bottom substrate top surface 132 and the top substrate bottom surface 120.

The bottom substrate top surface 132 and the top substrate bottom surface 120 meet at a third bonding interface 134. Preferably, but not necessarily, the bottom substrate top surface 132 is configured to support a bottom substrate top metallization 135.

The bottom substrate top metallization 135 comprises a bottom substrate top ground plane 135A, a first bottom substrate top signal line 135B, a circular bottom substrate top metallization via pad 135C, and a second bottom substrate top signal line 135D. Together the first top substrate bottom signal line 122B and the first bottom substrate top signal line 135B form a first mid-substrate signal line 122B-135B.

The bottom substrate top metallization 135 comprises one or more bottom substrate top metallization openings 136A-136C. For example, and as depicted, the bottom substrate top metallization 135 comprises three bottom substrate top metallization openings 136A-136C, a first bottom substrate top metallization opening 136A, a second bottom substrate top metallization opening 136B, and a third bottom substrate top metallization opening 136C.

As described below in more detail, the first bottom substrate top metallization opening 136A is configured so as to approximately align with the first top substrate bottom cavity 123A. Similarly, the second bottom substrate top metallization opening 136B is configured so as to approximately align with the second top substrate bottom cavity 123B. Again, the third bottom substrate top metallization opening 136C is configured so as to approximately align with the third top substrate bottom cavity 123C. In designing the H-frame device 100, the first top substrate bottom cavity 123A is approximately matched in shape to the first bottom substrate top metallization opening 136A. Similarly, in designing the H-frame device 100, the second top substrate bottom cavity 123B is approximately matched in shape to the second bottom substrate top metallization opening 1366. Again, in designing the H-frame device 100, the third top substrate bottom cavity 123C is approximately matched in shape to the third bottom substrate top metallization opening 136C.

For example, the bottom substrate top metallization 135 has a thickness between approximately 1 micron and approximately 13 microns. For example, the bottom substrate top metallization 135 has a thickness of approximately 3.5 microns. For example, the bottom substrate top metallization 135 has a thickness of approximately 5.5 microns. The bottom substrate top metallization 135 is preferably in electrical contact with the top substrate bottom metallization 122, thereby creating a vertical electrical connection between the top substrate bottom metallization 122 and the bottom substrate top metallization 135. Bonding of the bottom cover 106 to the bottom substrate 126 creates a first vertical electrical connection between the bottom substrate 126 and the bottom cover 106.

Using the first vertical electrical connection, the top substrate top metallization 116 is electrically connected to the top substrate bottom metallization 122 at an outer side of the top cover 102. A shape in the top substrate bottom metallization 122 connects the first vertical electrical connection at an outer side of the top cover 102 to a first vertical electrical connection at an inner side of the top cover 102. Using the first vertical electrical connection, the top substrate bottom metallization 122 is electrically connected to the top substrate top metallization 116 on an inner side of the top cover 102.

Using the second vertical electrical connection, the bottom substrate bottom metallization 130 is electrically connected to the bottom substrate top metallization 135 at an inner side of the bottom cover 106.

The bottom substrate bottom metallization 130 further comprises a bottom substrate bottom signal line 137 configured to conduct a signal.

The bottom substrate bottom metallization 130 comprises one or more bottom substrate bottom metallization openings 138. As depicted, the bottom substrate metallization 130 comprises one bottom substrate bottom metallization opening 138. The bottom substrate bottom metallization opening 138 comprises a fully formed bottom substrate bottom metallization opening 138.

As described below in more detail, the bottom substrate bottom metallization opening 138 is designed so as to approximately align with the bottom cover cavity 108.

The bottom substrate 126 further comprises a plurality of bottom substrate through-substrate signal vias 140A-140B, the bottom substrate through-substrate vias 140A-140B configured to provide a second vertical electrical connection between the bottom substrate top metallization 135 and the bottom substrate bottom metallization 130. Bonding of the bottom cover 106 to the bottom substrate 126 creates the second vertical electrical connection between the bottom substrate 126 and the bottom cover 106.

As described below in more detail, the bottom substrate through-substrate vias 140A-140B are preferably hermetically sealed, electrical feed-through vias. The bottom substrate through-substrate vias 140A-140B are preferably formed, as described below in more detail, by etching through the top substrate 112 and plating an interior wall of a void produced by the etching. A top surface of at least one of the bottom substrate through-substrate vias 140A-140B is preferably sealed. For example, a top surface of at least one of the bottom substrate through-substrate vias 140A-140B is preferably sealed using gold. For example, a top surface of at least one of the bottom substrate through-substrate vias 140A-140B is preferably sealed using a solid cap comprising gold. For example, a top surface of at least one of the bottom substrate through-substrate vias 140A-140B is preferably sealed using a solid cap consisting of gold. The bottom substrate through-substrate signal vias 140A-140B are configured to provide high isolation while conducting an electronic signal from the bottom substrate top metallization 135 to the bottom substrate bottom metallization 130.

The bottom substrate through-substrate signal vias 140A-140B comprise a first bottom substrate signal via 140A and a second bottom substrate signal via 140B. These two bottom substrate signal vias 140A and 140B are described in more detail in FIGS. 1H, 2A, and 2G.

The bottom substrate 126 further comprises a plurality of bottom substrate through-substrate ground vias 141A-141N, the bottom substrate through-substrate ground vias 141A-141N configured to provide electrical grounding. The bottom substrate ground vias 141A-141N comprise a first bottom substrate ground via 141A, a second bottom substrate ground via 141F, and a third bottom substrate ground via 141H. Functions of the first bottom substrate ground via 141A, the second bottom substrate ground via 141F, and the third bottom substrate ground via 141H are described in more detail in FIG. 1H.

Figure 1B:
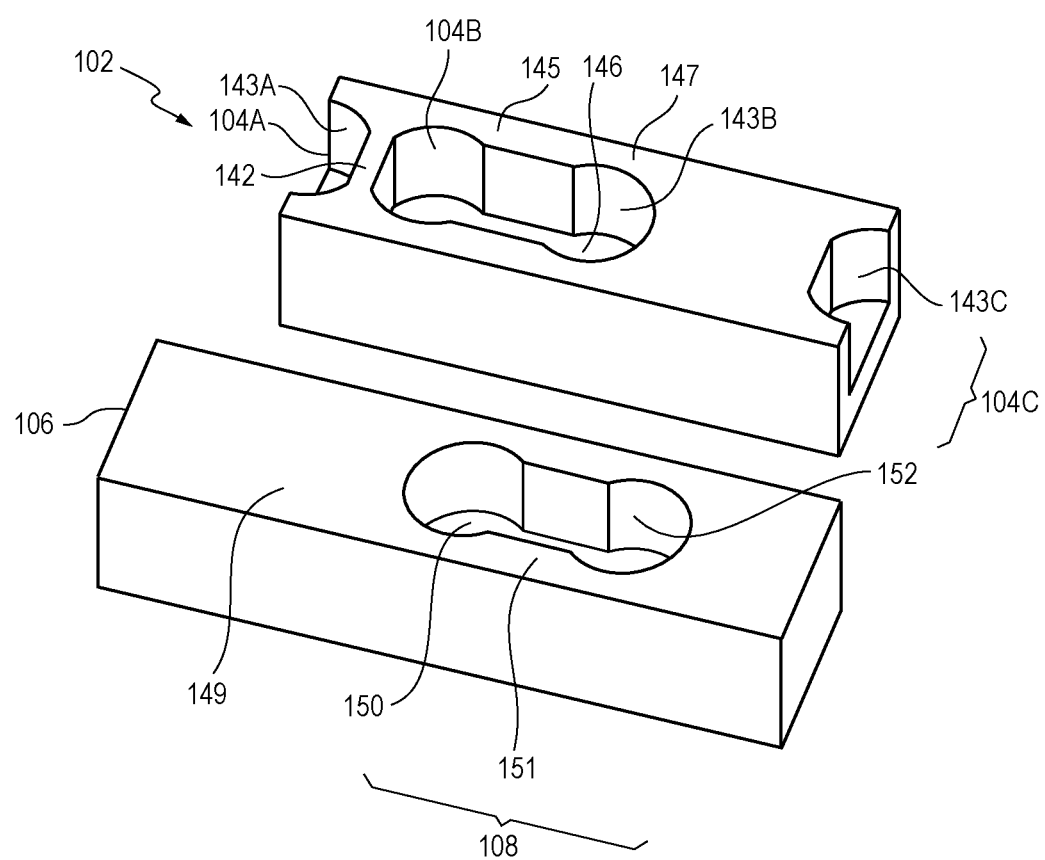

FIG. 1B shows a detail view of the top cover 102 and the bottom cover 106.

The top cover 102 again comprises the first top cover cavity 104A, the second top cover cavity 104B, and the third top cover cavity 104C.

The first top cover cavity 104A again comprises the partial first top cover cavity 104A. The partial first top cover cavity 104A comprises a top first cavity wall 143A. The top first cavity wall 143A will be visible after the top cover 102 is bonded to the substrate 110 as described in more detail below.

The second top cover cavity 104B again comprises the fully formed second top cover cavity 104B. The second top cover cavity 104B comprises a second top cavity wall 143B.

The third top cover cavity 104C again comprises the partial third top cover cavity 104C. The partial third top cover cavity 104C comprises a top third cavity wall 143C. The top third cavity wall 143C will be visible after the top cover 102 is bonded to the substrate 110 as described in more detail below.

The top cover 102 further comprises top cover metallization 145. The top cover metallization 145 grounds the top cover 102. The top cover metallization 145 thereby provides an integral part of the overall grounding structure of the microelectronics H-frame device 100. For example, the top cover metallization 145 comprises a singly-connected top cover metallization 145. For example, as discussed below in more detail, the top cover metallization 145 is produced by performing gold plating on a micromachined silicon wafer.

The top cover metallization 145 comprises a metallized top cavity floor 146. The second top cover cavity 104B comprises the metallized top cavity floor 146. Upon bonding of the top cover 102 to the top substrate 120, the metallized top cavity floor 146 becomes a top cover ceiling 146 of the top cover 102.

The top cover metallization 145 further comprises a metallized top cover top surface 147. As described below in more detail, during fabrication of the device (item 100 in FIG. 1A), the metallized top cover top surface 147 Is bonded to bumps on the top substrate top surface 114 to complete bonding.

The top cover metallization 145 further comprises a metallized second top cavity wall 143B. The second top cover cavity 104B comprises the metallized second top cavity wall 143B.

The bottom cover 106 further comprises bottom cover metallization 149. The bottom cover metallization 149 grounds the top cover 102. The bottom cover metallization 149 thereby provides an integral part of the overall grounding structure of the microelectronics H-frame device (item 100 in FIG. 1A). For example, the bottom cover metallization 149 comprises a singly-connected bottom cover metallization 149. For example, as discussed below in more detail, the bottom cover metallization 149 is produced by performing gold plating on a micromachined silicon wafer.

The bottom cover metallization 149 comprises a metallized bottom cavity floor 150. The bottom cover cavity 108 comprises the metallized bottom cavity floor 150. Upon bonding of the bottom cover 106 to the bottom substrate 126, the metallized bottom cavity floor 150 becomes a floor 150 of the bottom cover 106.

The bottom cover metallization 149 further comprises a metallized bottom cover top surface 151. As described below in more detail, during fabrication of the device (item 100 in FIG. 1A), the metallized bottom cover top surface 151 Is bonded to bumps on the bottom substrate bottom surface (item 128 in FIG. 1A) to complete bonding.

The bottom cover metallization 149 further comprises a metallized bottom cavity wall 152. The bottom cover cavity 108 comprises the metallized bottom cavity wall 152.

Figure 1C:
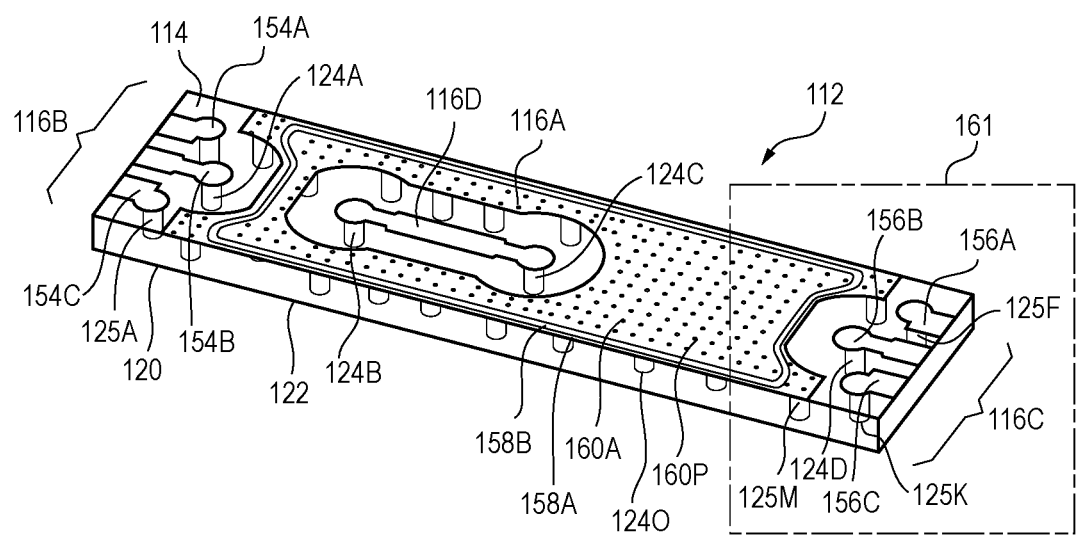

FIG. 1C shows a detailed view of the top substrate 112. The top substrate 112 again comprises the top substrate top surface 114, the top substrate top metallization 116, the top substrate bottom surface 120, the top substrate through-substrate vias 124A-124D, and the top substrate ground vias 125A, 125K, and 125M. The top substrate bottom surface 120 again comprises the top substrate bottom metallization 122.

The top substrate top metallization 116 again comprises the top substrate top ground plane 116A, the first input/output port 116B, the second input/output port 116C, and the first top substrate top signal line 116D.

The top substrate 112 again further comprises the first input/output port 116B. Preferably, although not necessarily, the top substrate top surface 114 comprises the first input/output port 116B. The first input/output port 116B is configured to do one or more of receive an input signal and transmit an output signal. The first input/output port 116B comprises a first port first ground metal pad 154A, a first port signal metal pad 154B, and a first port second ground metal pad 154C. The first port signal metal pad comprises a second signal line 154B.

The first port first ground metal pad 154A is operably connected to the top substrate bottom surface 120 by one or more of the top substrate through-substrate vias 124A-124D. The first port second ground metal pad 154C is operably connected to the top substrate ground plane 120 by one or more of the top substrate through-substrate vias 124A-124D.

The top substrate 112 further comprises the second input/output port 116C. Preferably, although not necessarily, the top substrate top surface 114 comprises the second input/output port 116C. The second input/output port 116C is configured to do one or more of receive an input signal and transmit an output signal. The second input/output port 116C comprises a second port first ground metal pad 156A, a second port signal metal pad 156B, and a second port second ground metal pad 156C. The second port signal metal pad comprises a third signal line 156B.

The second port first ground metal pad 156A is operably connected to the top substrate bottom surface 120 by one or more of the top substrate through-substrate vias 124A-124D. The second port second ground metal pad 156C is operably connected to the top substrate bottom surface 120 by one or more of the top substrate through-substrate vias 124A-124D.

The top substrate top metallization 116 further comprises one or more top substrate top metallization continuous bumps 158A-158B. As depicted, the top substrate top metallization 116 comprises two top substrate top metallization concentric continuous bumps 158A, 158B, the concentric top substrate top metallization continuous bumps 158A, 158B usable for bonding the top substrate 112 to the top cover 102. Preferably, the concentric top substrate top metallization continuous bumps 158A, 158B are spaced so as to be separated by less than approximately 0.1 wavelength of the highest frequency of interest.

The top substrate top metallization 116 further comprises one or more top substrate top metallization discrete bumps 160A-160P, the top substrate top metallization discrete bumps 160A-160P usable for bonding the top substrate 112 to the top cover 102. Preferably, the top substrate top metallization discrete bumps 160A-160P are spaced so as to be separated by less than approximately 0.1 wavelength of the highest frequency of interest.

Preferably, the top substrate top metallization continuous bumps 158A, 158B are configured to provide an environmental seal configured to prevent foreign particles from entering the top cover 102 after formation of the bond at the top substrate top surface 114, thereby protecting the H-frame device 100.

Preferably, the top substrate top metallization discrete bumps 160A-160P are configured to provide an environmental seal configured to prevent foreign particles from entering the top cover 102 after formation of the bond at the top substrate top surface 114, thereby protecting the H-frame device 100.

Figure 1D:
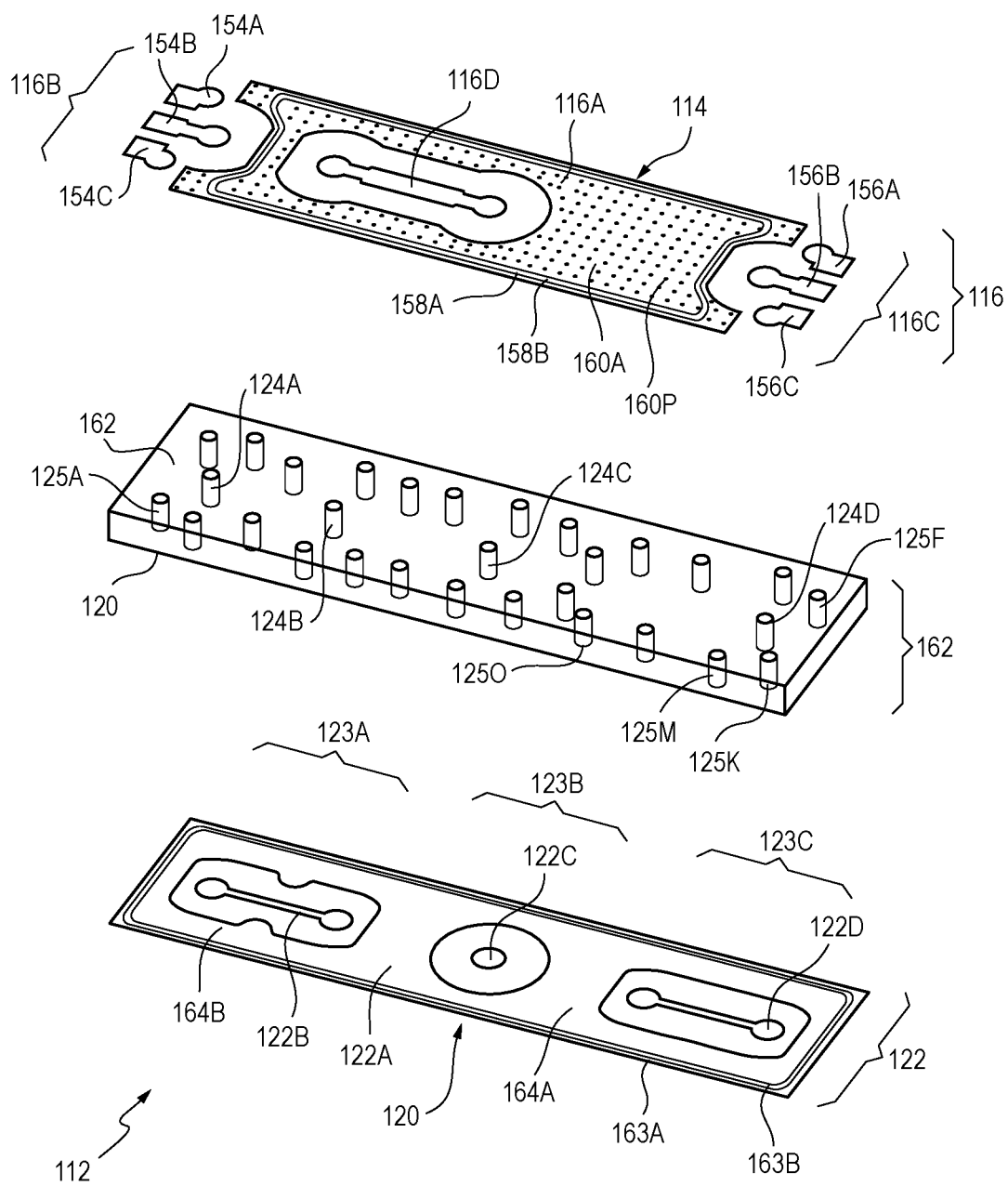
Figure 1E:
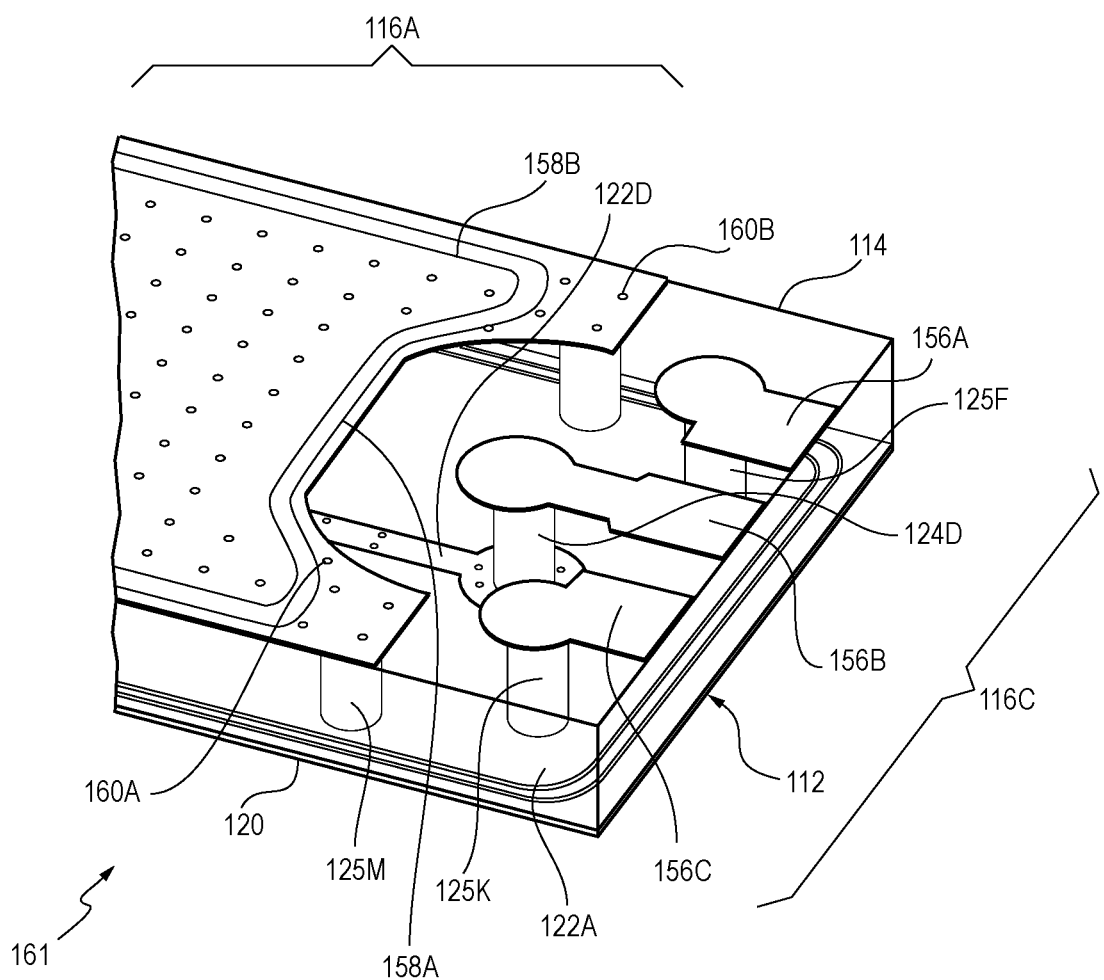

Dotted line 161 in FIG. 1C is the boundary of a detail view of the device provided and discussed in more detail in FIG. 1E.

FIG. 1D shows an exploded view of the top substrate 112. The top substrate 112 comprises the top substrate top metallization 116, the top substrate bottom metallization 122, and a top dielectric 162. The top dielectric 162 comprises an electrical insulator 162. The top substrate top metallization 116 again comprises the top substrate through-substrate vias 124A-124D, the top substrate top metallization 125F, 125K, and 125M, the top substrate top metallization continuous bumps 158A-158B and the top substrate top metallization discrete bumps 160A-160P.

Also shown again are the top substrate top surface 114, the top substrate bottom surface 120, and the top substrate through-substrate vias 124A-124D.

The top substrate top metallization 116 further comprises the first input/output port 116B. The top substrate top metallization 116 further comprises the second input/output port 116C.

The top dielectric 162 comprises the top substrate top surface 114, the top substrate bottom surface 120, and the top substrate through-substrate vias 124A-124D.

The first input/output port 116B again comprises the first port first ground metal pad 154A, the first port signal metal pad 154B, and the first port second ground metal pad 154C. The first port first ground metal pad 154A is again operably connected to the top substrate bottom ground plane 122A by one or more of the top substrate through-substrate vias 124A-124D. The first port second ground metal pad 154C is operably connected to the top substrate ground plane 122A by one or more of the top substrate through-substrate vias 124A-124D.

The second input/output port 116C again comprises the second port first ground metal pad 156A, the second port signal metal pad 156B, and the second port second ground metal pad 156C. The second port first ground metal pad 156A is again operably connected to the top substrate bottom ground plane 122A by one or more of the top substrate through-substrate vias 124A-124D. The second port second ground metal pad 156C is again operably connected to the top substrate ground plane 122A by one or more of the top substrate through-substrate vias 124A-124D.

The top substrate bottom metallization 122 comprises a top substrate bottom ground plane 122A that is grounded. The top substrate bottom metallization 122 comprises a first top substrate bottom signal line 122B configured to conduct a signal. The top substrate bottom metallization 122 again comprises the first top substrate bottom metallization opening 123A, the second top substrate bottom metallization opening 123B, and the third top substrate bottom metallization opening 123C.

In designing the H-frame device 100, the first top substrate bottom signal line 122B is approximately matched in shape to the bottom substrate top signal line (not shown in FIG. 1D; item 135B shown in FIG. 1A). The first top substrate bottom signal line 122B is bonded at the third bonding interface 134 to the bottom substrate top signal line (not shown in FIG. 1D; item 135B shown in FIG. 1A) using a plurality of bonding bumps (not shown in FIG. 1D). Together the first top substrate bottom signal line 122B and the first bottom substrate top signal line (not shown in FIG. 1D; item 135B shown in FIG. 1A) form the first midsubstrate signal line 122B-135B.

In designing the H-frame device 100, the circular top substrate bottom metallization via pad 122C is approximately matched in shape to the circular bottom substrate top metallization via pad (not shown in FIG. 1D; item 135C shown in FIG. 1A). The circular top substrate bottom metallization via pad 122C is bonded at the third bonding interface 134 to the circular bottom substrate top metallization via pad (not shown in FIG. 1D; item 135C shown in FIG. 1A) using a plurality of bonding bumps (not shown in FIG. 1D). Together, circular top substrate bottom metallization via pad 122C and the circular bottom substrate top metallization via pad (not shown in FIG. 1D; item 135C shown in FIG. 1A) form a via pad 122C-135C, helping to provide one or more of an electrical connection and electrical fencing.

The top substrate bottom metallization 122 again further comprises the circular top substrate bottom metallization 122C and the second top substrate bottom signal line 122D.

The top substrate bottom metallization 122 further comprises one or more top substrate bottom metallization continuous bumps 163A-163B. As depicted, the top substrate bottom metallization 122 comprises two concentric top substrate bottom metallization continuous bumps 163A, 163B, the concentric top substrate bottom metallization continuous bumps 163A, 163B usable for bonding the top substrate 112 to the bottom substrate 126. Preferably, the concentric top substrate bottom metallization continuous bumps 163A, 163B are spaced so as to be separated by less than approximately 0.1 wavelength of the highest frequency of interest.

The top substrate bottom metallization 122 further comprises one or more top substrate bottom metallization discrete bumps 164A-164P, the top substrate bottom metallization discrete bumps 164A-164P usable for bonding the top substrate 112 to the bottom substrate 126. Preferably, the top substrate bottom metallization discrete bumps 164A-164P are spaced so as to be separated by less than approximately 0.1 wavelength of the highest frequency of interest.

Preferably, the top substrate bottom metallization continuous bumps 163A, 163B are configured to provide an environmental seal configured to prevent foreign particles from entering the substrate 110 after formation of the bond at the top substrate bottom surface 120, thereby protecting the H-frame device 100.

Preferably, the top substrate bottom metallization discrete bumps 164A-164P are configured to provide an environmental seal configured to prevent foreign particles from entering the substrate 110 after formation of the bond at the top substrate bottom surface 120, thereby protecting the H-frame device 100.

FIG. 1E shows a detail view of a portion 161 of FIG. 1C, showing a portion of the top substrate 112. Dotted line 161 in FIG. 1C is the boundary of the detail view of the device shown in FIG. 1E.

The top substrate 112 again comprises the top substrate top surface 114, the top substrate top metallization 116A and 116C, the top substrate bottom surface 120, and the top substrate through-substrate vias 124A-124D, and the top substrate ground vias 125F, 125K, and 125M.

The top substrate 112 again further comprises the second input/output port 116C. Preferably, although not necessarily, the top substrate top surface 114 comprises the second input/output port 116C. The second input/output port 116C again comprises a second port first ground metal pad 156A, a second port signal metal pad 156B, and a second port second ground metal pad 156C.

The second port first ground metal pad 156A is operably connected to the top substrate bottom ground plane 122A by the second top substrate ground via 125F. The second port second signal metal pad 156B is operably connected to the second top substrate bottom signal line 122D by the fourth top substrate through-substrate via 124D. The fourth top substrate through-substrate via 124D comprises a hot top substrate ground via 124D usable in a transition. The second port third top metal pad 156C is operably connected to the top substrate bottom ground plane 122A by the third top substrate ground via 125K. The third top substrate ground via 125K is configured to provide general grounding of one or more of the top substrate 112 and the H-frame device 100. The fourth top substrate ground via 125M is configured to provide general grounding of one or more of the top substrate 112 and the H-frame device 100.

The top substrate top metallization 116 again further comprises one or more top substrate top metallization continuous bumps 158A-158B. As depicted, the top substrate top metallization 116 comprises two concentric top substrate top metallization continuous bumps 158A, 158B, the concentric top substrate top metallization continuous bumps 158A, 158B usable for bonding the top substrate 112 to the top cover 102. Preferably, the top substrate top metallization concentric continuous bumps 158A, 158B are spaced so as to be separated by less than approximately 0.1 wavelength of the highest frequency of interest.

The top substrate top metallization 116 again further comprises the one or more top substrate top metallization discrete bumps 160A-160P, the top substrate top metallization discrete bumps 160A-160P usable for bonding the top substrate 112 to the top cover 102. Preferably, the discrete bumps 160A-160P are spaced so as to be separated by less than approximately 0.1 wavelength of the highest frequency of interest.

Preferably, the top substrate top metallization continuous bumps 158A, 158B are again configured to provide an environmental seal configured to prevent foreign particles from entering the top cover 102 after formation of the bond at the top substrate top surface 114, thereby protecting the H-frame device 100.

Figure 1F:
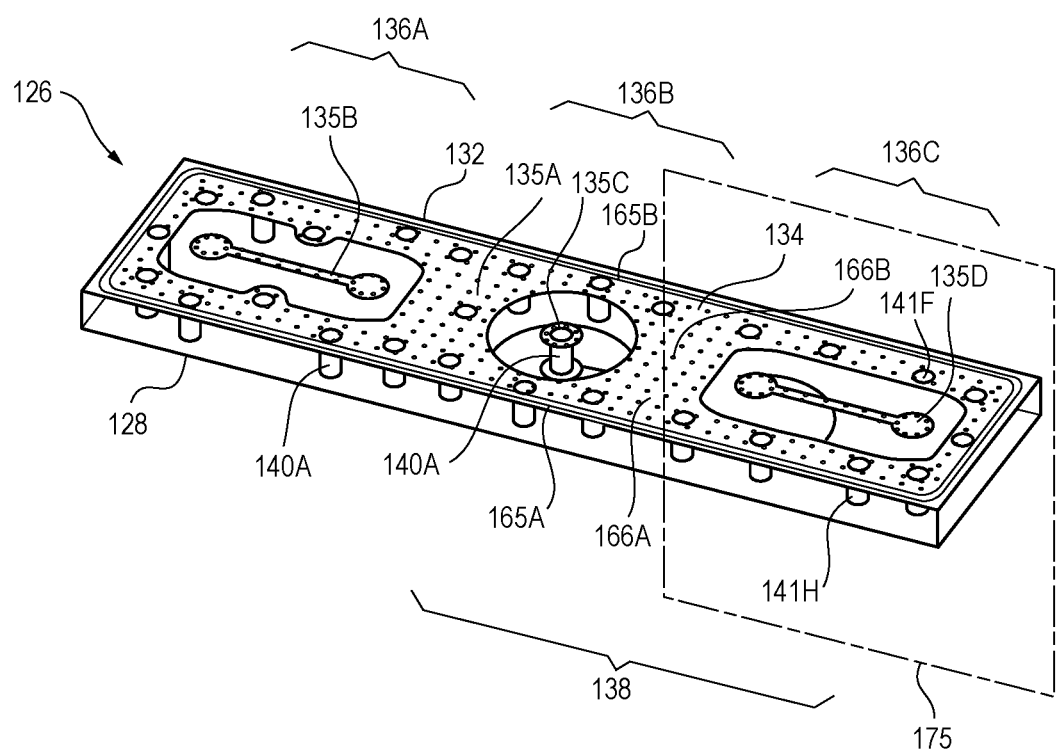

FIG. 1F shows a detailed view of the bottom substrate 126. The bottom substrate 126 again comprises the bottom substrate bottom surface 128, the bottom substrate top surface 132, the bottom substrate top metallization 135 (shown in more detail here so accordingly four bottom substrate top metallization regions are shown here), the bottom substrate bottom metallization opening 138, the bottom substrate through-substrate vias 140A and 140B, and the bottom substrate ground vias 141F and 141H. The bottom substrate top surface 132 again comprises the bottom substrate top metallization 135. The bottom substrate top metallization 135 again comprises the first bottom substrate first metallization opening 136A, the second bottom substrate top metallization opening 136B, and the third bottom substrate top metallization opening 136C.

The bottom substrate top metallization 135A further comprises one or more bottom substrate top metallization continuous bumps 165A-165B. As depicted, the bottom substrate top metallization 135A comprises two concentric bottom substrate top metallization continuous bumps 165A, 165B, the concentric bottom substrate top metallization continuous bumps 165A, 165B usable for bonding the bottom substrate 126 to the top substrate 112. Preferably, the concentric bottom substrate top metallization continuous bumps 165A, 165B are spaced so as to be separated by less than approximately 0.1 wavelength of the highest frequency of interest.

The bottom substrate top metallization 135A further comprises one or more bottom substrate top metallization discrete bumps 166A-166P, the bottom substrate top metallization discrete bumps 166A-166P usable for bonding the bottom substrate 126 to the top substrate 112. Preferably, the bottom substrate top metallization discrete bumps 166A-166P are spaced so as to be separated by less than approximately 0.1 wavelength of the highest frequency of interest.

Preferably, the bottom substrate top metallization continuous bumps 165A, 165B are configured to provide an environmental seal configured to prevent foreign particles from entering between the top substrate 112 and the bottom substrate 126 after formation of the bond at surface 134, thereby protecting the H-frame device 100.

Preferably, the bottom substrate top metallization discrete bumps 166A-166P are configured to provide one or more of an environmental seal configured to prevent one or more of moisture and foreign particles from entering between the top substrate 112 and the bottom substrate 126 after formation of the bond at the bottom substrate top surface 132, thereby protecting the H-frame device 100.

Figure 1G:
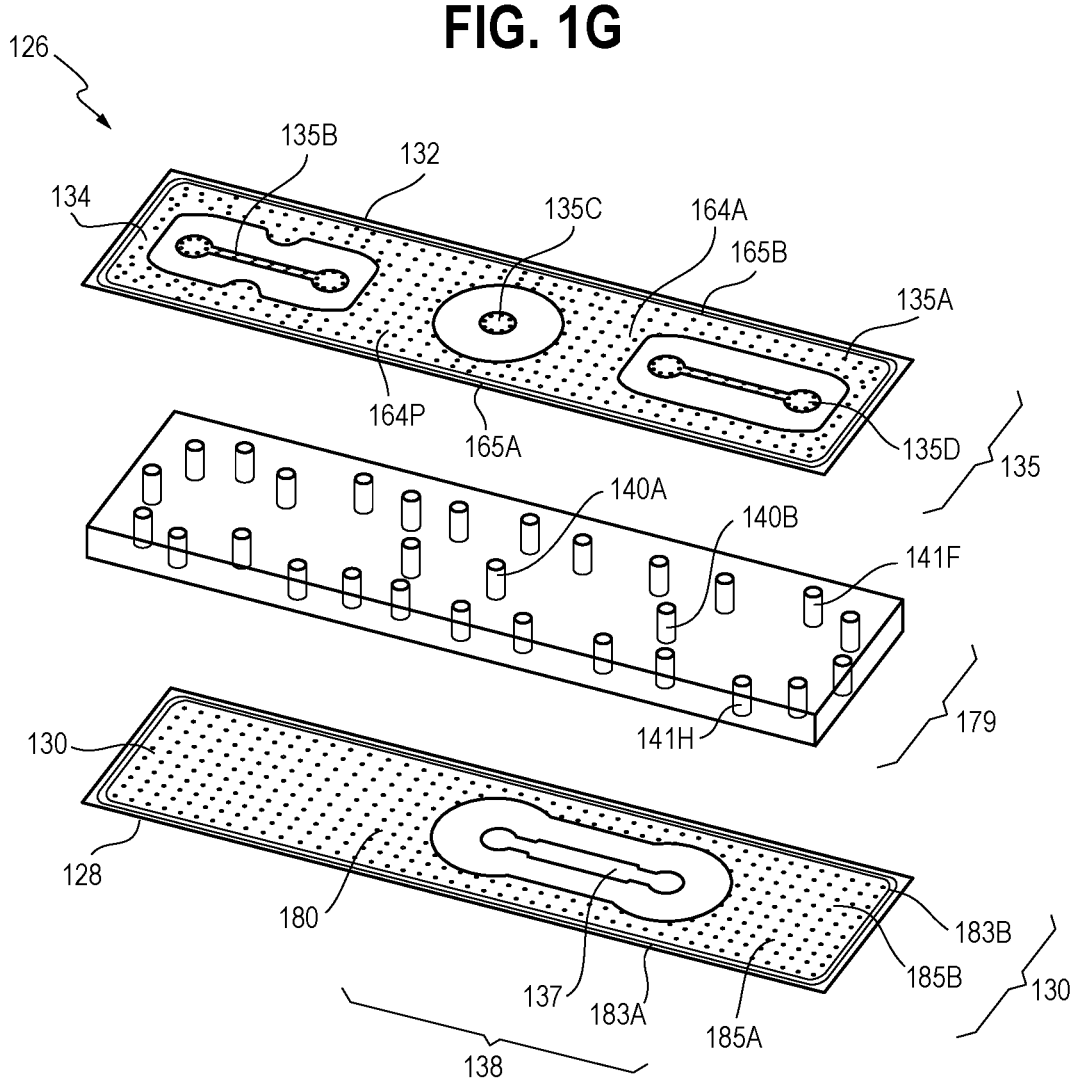
Figure 1H:
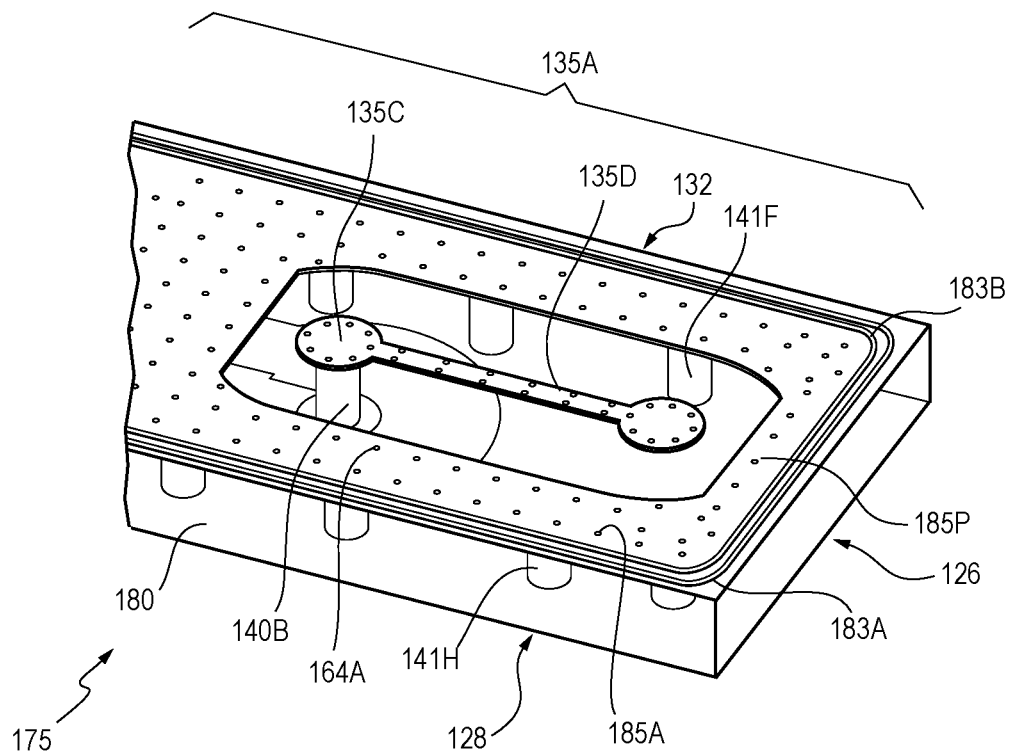

Dotted line 175 in FIG. 1F is the boundary of a detail view of the device provided and discussed in more detail in FIG. 1H.

FIG. 1G shows an exploded view of the bottom substrate 126. The bottom substrate 126 again comprises the bottom substrate bottom metallization 130, the bottom substrate top metallization 135, and the bottom substrate bottom metallization opening 138. The bottom substrate bottom metallization 130 comprises a bottom substrate bottom signal line 137 configured to conduct a signal.

The bottom substrate 126 further comprises a bottom dielectric 179. The bottom dielectric 179 comprises an electrical insulator. The bottom substrate top metallization 135 again comprises the bottom substrate top metallization continuous bumps 165A-165B and the bottom substrate top metallization discrete bumps 166A-166P.

Also shown again are the bottom substrate bottom surface 128, the bottom substrate top surface 132, the bottom substrate through-substrate vias 140A and 140B, and the bottom substrate ground vias 141F and 141H.

The bottom dielectric 179 comprises the bottom substrate bottom surface 128, the bottom substrate top surface 132, and the bottom substrate through-substrate vias 140A and 140B.

The bottom substrate bottom metallization 130 comprises a bottom substrate bottom ground plane 180 that is grounded. The bottom substrate bottom metallization 130 comprises a bottom substrate bottom signal line 137 configured to conduct a signal.

The bottom substrate bottom metallization 130 further comprises one or more bottom substrate bottom metallization continuous bumps 183A-183B. As depicted, the bottom substrate bottom metallization 130 comprises two concentric bottom substrate bottom metallization continuous bumps 183A, 183B, the bottom substrate bottom metallization concentric continuous bumps 183A, 183B usable for bonding the bottom substrate 126 to the bottom cover 106. Preferably, the bottom substrate bottom metallization concentric continuous bumps 183A, 1836 are spaced so as to be separated by approximately 0.1 wavelength of the highest frequency of interest. Preferably, the bottom substrate bottom metallization discrete bumps 185A-185P are spaced so as to be separated by less than approximately 0.1 wavelength of the highest frequency of interest.

Preferably, the bottom substrate bottom metallization continuous bumps 183A, 183B are configured to provide an environmental seal configured to prevent foreign particles from entering the substrate 110 after formation of the bond at the bottom substrate bottom surface 128, thereby protecting the H-frame device 100.

Preferably, the bottom substrate bottom metallization discrete bumps 185A-185P are configured to provide one or more of an environmental seal configured to prevent one or more of moisture and foreign particles from entering the bottom cover 106 after formation of the bond at the bottom substrate bottom surface 128, thereby protecting the H-frame device 100.

FIG. 1H shows a detail view of a portion 175 of FIG. 1F, showing a portion of the bottom substrate 126. Dotted line 175 in FIG. 1F is the boundary of the detail view of the device shown in FIG. 1H.

The bottom substrate 126 again comprises the bottom substrate bottom surface 128, the bottom substrate top surface 132, the bottom substrate top metallization 135A and 135C-135D, the bottom substrate through-substrate vias 140A and 140B, the bottom substrate top metallization concentric continuous bumps 165A-165B, the bottom substrate top metallization discrete bumps 164A-164P, and the bottom substrate bottom ground plane 180. Preferably, the concentric bottom substrate bottom metallization continuous bumps 165A, 165B are spaced so as to be separated by less than approximately 0.1 wavelength of the highest frequency of interest.

The bottom substrate 126 comprises the second bottom substrate through-substrate via 140B, which comprises a second hot bottom substrate through-substrate via 140B usable in a transition. The bottom substrate 126 further comprises the second bottom substrate ground via 141F and the third bottom substrate ground via 141H. The second bottom substrate ground via 141F is configured to provide general grounding of one or more of the bottom substrate 126 and the H-frame device 100. Similarly, the third bottom substrate ground via 141H is configured to provide general grounding of one or more of the bottom substrate 126 and the H-frame device 100.

The bottom substrate bottom metallization 130 further comprises one or more discrete bumps 185A-185P, the discrete bumps 185A-185P usable for bonding the bottom substrate 126 to the bottom cover 106. Preferably, the discrete bumps 185A-185P are spaced so as to be separated by less than approximately 0.1 wavelength of the highest frequency of interest.

Preferably, the bottom substrate bottom metallization continuous bumps 183A, 183B are configured to provide an environmental seal configured to prevent foreign particles from entering bottom cavity (not shown in this figure; item 108 in FIG. 1A) after formation of the bond at the bottom substrate bottom surface 128 to the bottom cover 106, thereby protecting the H-frame device 100.

Figure 2:
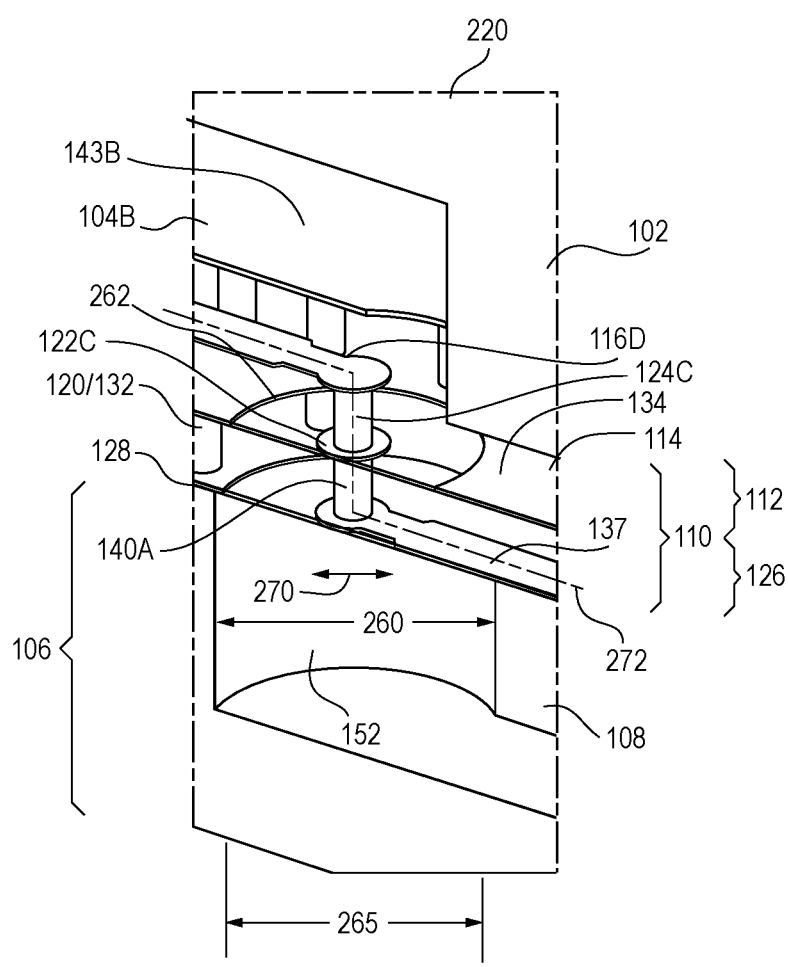
FIG. 2 is a drawing showing a detail of a signal entering a vertical feed-through sub-circuit in the H-frame device.

FIG. 2 is a drawing showing a detail of a signal entering a vertical feed-through sub-circuit 220 in the H-frame device 100.

FIG. 2 shows a detail of a sub-circuit 220 (this is the same sub-circuit 220 as the second sub-circuit 220 described in FIG. 2E of the "Microelectronics H-Frame Device" application), illustrating a vertical feed-through circuit 220 of a signal entering the sub-circuit 220 of the H-frame device 100. The H-frame device 100 again comprises the top cover 102, the bottom cover 106, and the substrate 110. The top cover 102 again comprises the second top cavity 104B. The second top cavity 104B again comprises the second top cavity wall 143B. The bottom cover 106 again comprises the bottom cavity 108. The bottom cavity 108 again comprises the bottom cavity wall 152. The bottom cavity 108 has a representative bottom cavity diameter 260 equal to approximately 800 microns.

The substrate 110 again comprises the top substrate 112 and the bottom substrate 126. The top substrate 112 again comprises the top substrate top surface 114 and the top substrate bottom surface 120. The top substrate top surface 114 again comprises the first top substrate top signal line 116D. The bottom substrate 126 again comprises the bottom substrate top surface 132, which after assembly is joined to the top substrate bottom surface 120 at the third bonding interface 134. The top substrate bottom surface 120 again comprises the first signal bottom substrate signal via 140A and the bottom substrate bottom signal line 137. The bottom substrate top surface 132 and the top substrate bottom surface 120 comprise a top and bottom metallization opening 262 where the substrate material has been removed, allowing the signal to pass through the bottom substrate top surface 132 and the top substrate bottom surface 120. The top and bottom metallization opening 262 has a representative cutout diameter 265 equal to approximately 600 microns.

The bottom surface again further comprises the bottom substrate bottom surface 128.

An electronic signal preferably enters the sub-circuit 220 on the top substrate top surface 114 from the first sub-circuit 210 via the first top substrate top signal line 116D. The electronic signal passes from the first top substrate top signal line 116D to the third top substrate signal via 124C before running into the second top cavity wall 143B. The third top substrate signal via 124C electrically connects the first top substrate top signal line 116D to the via pad 122C-135C, discussed above with regard to FIG. 1D.

As mentioned in regard to FIG. 1D, in designing the H-frame device 100, the circular top substrate bottom metallization via pad 122C is approximately matched in shape to the circular bottom substrate top metallization via pad (not shown in FIG. 2; item 135C shown in FIG. 1A). The circular top substrate bottom metallization via pad 122C is bonded at the third bonding interface 134 to the circular bottom substrate top metallization via pad (not shown in FIG. 2; item 135C shown in FIG. 1A) using a plurality of bonding bumps (not shown in FIG. 2). Together, circular top substrate bottom metallization via pad 122C and the circular bottom substrate top metallization via pad (not shown in FIG. 2; item 135C shown in FIG. 1A) form a via pad 122C-135C, helping to provide one or more of an electrical connection and electrical fencing. The via pad 122C-135C has a representative via pad diameter 270 equal to approximately 200 microns.

The third top substrate signal via 124C is joined to the bottom substrate top surface 132 at the third bonding interface 134. The third top substrate signal via 124C comprises a one-layer vertical feed-through 124E. The electronic signal then passes from the circular top substrate bottom metallization via pad 122C through the top and bottom metallization opening 262 to the first bottom substrate signal via 140A. The first bottom substrate signal via 140A electrically connects the signal to the bottom substrate bottom signal line 137. Once the signal reaches the bottom substrate bottom signal line 137, the signal continues as an inverted microstrip traveling away from the bottom cavity wall 152 and toward the third sub-circuit 230, which is shown in more detail in FIG. 2G of the "Microelectronics H-Frame Device" application that is being co-filed with this application.

The second top cavity wall 143B and the bottom cavity wall 152 comprise integral components of the vertical feed-through transition circuit 220. The second top cavity wall 143B and the bottom cavity wall 152 help gradually transform the direction of the electric field in the vertical feed-through transition circuit 220. The second top cavity wall 143B and the bottom cavity wall 152 essentially form a vertical channel connecting the, first top substrate top signal line 116D and the first bottom substrate signal via 140A. The, first top substrate top signal line 116D and the first bottom substrate signal via 140A each become horizontal channels 116D and 137 connected to each other via the one-layer vertical feed-through 124E, the circular top substrate bottom metallization via pad 122C, and the first bottom substrate signal via 140A. These elements together form a Z-shaped three-dimensional channelization 272 that prevents the signal from leaking into areas outside of the channelization 272. The Z-shape of the channelization 272 is an example; other configurations are possible within the scope of embodiments of the invention. The channelization 272 enables the electronic signal to do one or more of change direction and change height. As depicted, the signal, initially horizontal while running through the, first top substrate top signal line 116D, becomes vertical while passing through the one-layer vertical feed-through 124E, the circular top substrate bottom metallization via pad 122C, and the first bottom substrate signal via 140A. The signal then becomes horizontal again while passing through the bottom substrate bottom signal line 137.

The signal therefore exits the sub-circuit 220 on the right side of FIG. 2 via the bottom substrate bottom signal line 137, which is located on the bottom substrate bottom surface 128. Accordingly, the sub-circuit 220 has functioned as a vertical feed-through transition 220, receiving a signal on the top substrate top surface 114 via the first top substrate top signal line 116D, and producing an output signal on the bottom substrate bottom surface 128.

Figure 3B:
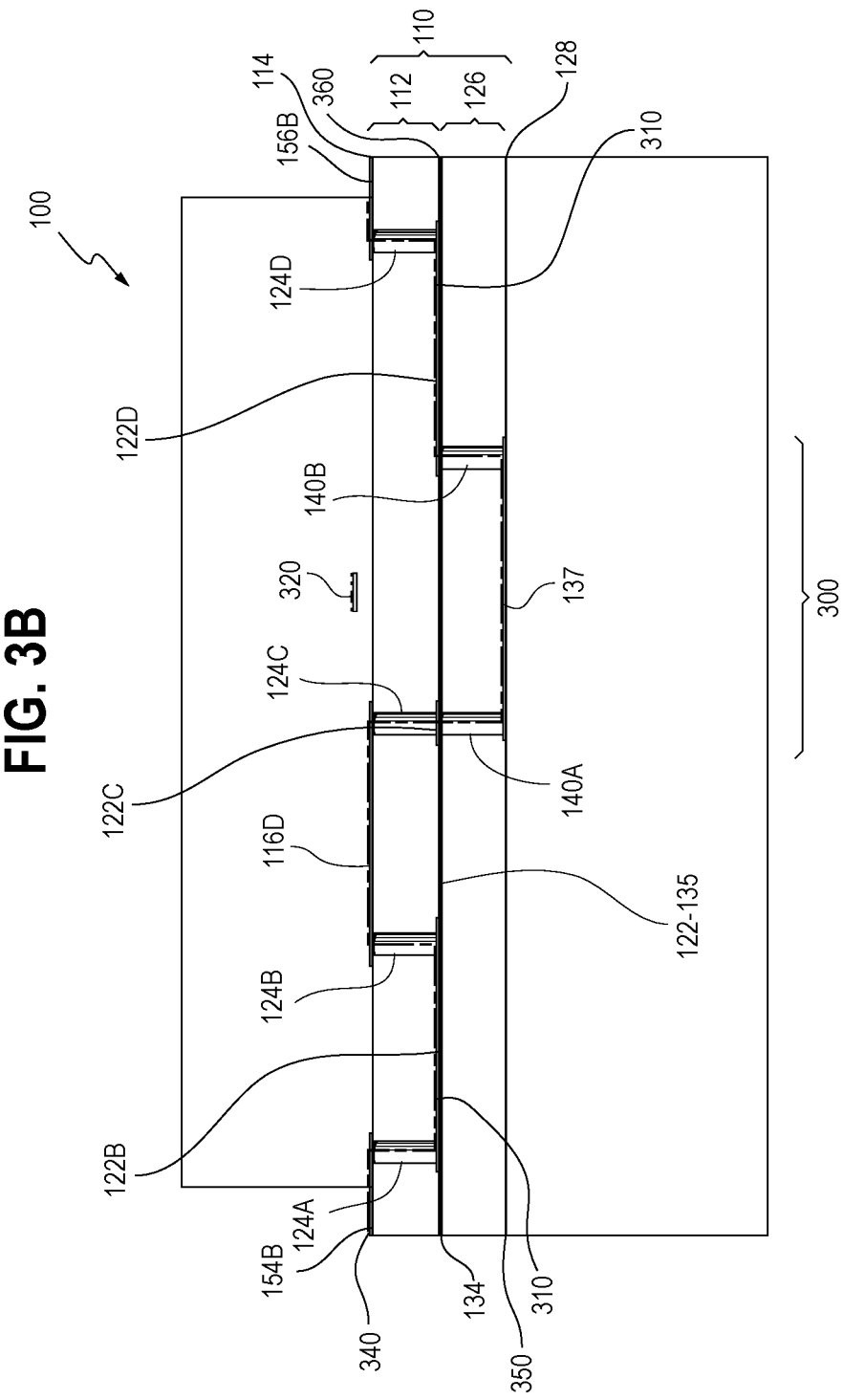

FIGS. 3A-3B is a set of two drawings showing views of a of a radio frequency (RF) crossover in the H-frame device.

FIG. 3A shows a view from above of the microelectronics H-frame device 100 comprising a radio frequency (RF) crossover 300. Shown again are the top cover 102, the second top cover cavity 104B, the bottom cover 106, the bottom cover cavity 108, the substrate 110, the top substrate 112, the first bonding interface 114, the first input/output port 116B, the second input/output port 116C, the first top substrate top signal line 116D, the top substrate bottom surface 120, the first top substrate bottom signal line 122B, the circular top substrate bottom metallization via pad 122C, the second top substrate bottom signal line 122D, the second top substrate signal via 124B, the third top substrate signal via 124C, the fourth top substrate signal via 124D, the first top substrate ground via 125A, the second top substrate ground via 125F, the third top substrate ground via 125K, the fourth top substrate ground via 125M, the bottom substrate 126, the second bonding interface 128, the third bonding interface 134, the bottom substrate bottom signal line 137, the first bottom substrate signal via 140A, the second bottom substrate signal via 140B, the first port first ground metal pad 154A, the first port signal metal pad 154B, the first port second ground metal pad 154C, the second port first ground metal pad 156A, the second port signal metal pad 156B, and the second port second ground metal pad 156C. In this example, a representative thickness of the SiC substrate 110 is approximately 200 microns and a relative dielectric value of the SiC substrate 110 is approximately 9.7.

The sub-circuit 220 comprises a vertical feed-through circuit 220 or microstrip 220. The vertical feed-through circuit 220 comprises the first top substrate top signal line 116D running on the top substrate top surface 114. The second microstrip 220 further comprises the top substrate bottom surface 120, which is positioned between the top substrate 112 and the bottom substrate 126.

The second sub-circuit 220 comprises a portion of the first top substrate signal line 116D, the third top substrate signal via 124C, the circular top substrate bottom metallization via pad 122C, the first bottom substrate signal via 140A, and a portion of the bottom substrate bottom signal line 137. The first top substrate signal line 116D is operably connected to the third top substrate signal via 124C. Preferably, and as depicted, the first top substrate signal line 116D is electrically connected to the third top substrate signal via 124C. The third top substrate signal via 124C is operably connected to the circular top substrate bottom metallization via pad 122C. Preferably, and as depicted, the first top substrate signal via 124C is electrically connected to the circular top substrate bottom metallization via pad 122C.

As can be seen more clearly in the circuit 205 of FIG. 2B of the "Microelectronics H-Frame Device" application, but as can also be seen here in item 310 of FIG. 3, a first signal line 310 comprises, taken in sequence from left to right, the second signal line 154B, the first top substrate signal line 124A, the first top substrate bottom signal line 122B, the second top substrate signal via 124B, the first top substrate top signal line 116D, the third top substrate signal via 124C, the circular top substrate bottom metallization via pad 122C, the first bottom substrate signal via 140A, the bottom substrate bottom signal line 137, the second bottom substrate bottom signal via 140B, the second top substrate bottom signal line 122D, the fourth top substrate signal via 124D, and finally the second port signal metal pad 156B.

The RF crossover 300 comprises a first signal line 310. The first signal line 310 is the same item as the circuit 205 of FIG. 2B of the "Microelectronics H-Frame Device" application. The RF crossover 300 further comprises a second signal line 320. The second signal line 320 traverses one or more of the top substrate 112 and the bottom substrate 126 at a non-zero angle 330 relative to the first signal line 310. As depicted in FIG. 3, the angle 330 equals ninety degrees, but any non-zero angle 330 is possible and is within the scope of embodiments of the invention. The top substrate bottom metallization (item 122 in FIGS. 1A, 1C, and 1D) and the bottom substrate top metallization (item 135 in FIGS. 1A, 1D, and 1F-1H) together form a ground plane 122-135 configured to provide isolation to allow the first signal line 310 to traverse one or more of the top substrate 112 and the bottom substrate 126 without being disturbed by the second signal line 320.

The first top substrate top signal line 116D is located on a first signal line first level 340. (We could as easily have decided to describe the RF crossover 300 comprising the first signal line 310 from right to left, in which case the description of the RF crossover 300 starts with the second top substrate bottom signal line 122D and proceeds right to left, to the second bottom substrate bottom signal via 140B, and then to the bottom substrate bottom signal line 137 and then to the first top substrate top signal line 116D.) The first signal line first level 340 comprises one or more of the top substrate top surface 114, the bottom substrate bottom surface 128, and the ground plane 122-135. As depicted, the first signal line first level 340 comprises the top substrate top surface 114.

The first signal line 310 successively passes through the third top substrate signal via 124C, the circular top substrate bottom metallization via pad 122C, the first bottom substrate signal via 140A, and then the bottom substrate bottom signal line 137, which is located on the bottom substrate bottom surface 128. The first signal line second level 350 comprises one or more of the top substrate top surface 114, the bottom substrate bottom surface 128, and the ground plane 122-135. As depicted, the first signal line second level 350 comprises the bottom substrate bottom surface 128.

At least one of the first signal line 310 and the second signal line 320 passes from the first signal line first level 340 to the first signal line second level 350 with the protection of the ground plane 122-135, thereby providing isolation from, respectively, one or more of the second signal line 320 and the first signal line 310. As depicted, with the protection of the ground plane 122-135, the first signal line 310 passes from the first signal line first level 340 to the first signal line second level 350 with the protection of the ground plane 122-135, thereby providing isolation from the second signal line 320. For example, the first signal line 310 passes from the first signal line first level 340 to the first signal line second level 350 through one or more of an escape transition, a crossover transition, and a feed-through transition. For example, the feed-through transition comprises a vertical feed-through transition.

Optionally, and as depicted, the second top substrate bottom signal line 122D is located on a first signal line third level 360. The first signal line third level 360 comprises one or more of the top substrate top surface 114, the bottom substrate bottom surface 128, and the ground plane 122-135. As depicted, the first signal line third level 360 comprises the ground plane 122-135.

At least one of the first signal line 310 and the second signal line 320 passes from the first signal line second level 350 to the first signal line third level 360 with the protection of the ground plane 122-135, thereby providing isolation from, respectively, one or more of the second signal line 320 and the first signal line 310. As depicted, with the protection of the ground plane 122-135, the first signal line 310 passes from the first signal line second level 350 to the first signal line third level 360 with the protection of the ground plane 122-135, thereby providing isolation from the second signal line 320. For example, the first signal line 310 passes from the first signal line second level 350 to the first signal line third level 360 through one or more of an escape transition, a crossover transition, and a feed-through transition. For example, the feed-through transition comprises a vertical feed-through transition.

FIG. 3B shows a direct side view of the microelectronics H-frame device 100 comprising a radio frequency (RF) crossover 300. Shown again are the top cover 102, the bottom cover 106, the bottom cover cavity 108, the substrate 110, the top substrate 112, the first bonding interface 114, the first input/output port 116B, the second input/output port 116C, the first top substrate top signal line 116D, the top substrate bottom surface 120, the first top substrate bottom signal line 122B, the circular top substrate bottom metallization via pad 122C, the second top substrate bottom signal line 122D, the second top substrate signal via 124B, the third top substrate signal via 124C, the fourth top substrate signal via 124D, the first top substrate ground via 125A, the second top substrate ground via 125F, the third top substrate ground via 125K, the fourth top substrate ground via 125M, the bottom substrate 126, the second bonding interface 128, the third bonding interface 134, the bottom substrate bottom signal line 137, the first bottom substrate signal via 140A, the second bottom substrate signal via 140B, the first port first ground metal pad 154A, the first port signal metal pad 154B, the first port second ground metal pad 154C, the second port first ground metal pad 156A, the second port signal metal pad 156B, and the second port second ground metal pad 156C. Not visible in FIG. 3B are the bottom substrate cavity (item 108 in FIG. 3A) and the angle (item 330 in FIG. 3A) between the first signal line 310 and the second signal line 320.

The sub-circuit 220 again comprises the first top substrate top signal line 116D running on the top substrate top surface 114. The second microstrip 220 again further comprises the top substrate bottom surface 120, which is positioned between the top substrate 112 and the bottom substrate 126.

The second sub-circuit 220 again comprises a portion of the first top substrate signal line 116D, the third top substrate signal via 124C, the circular top substrate bottom metallization via pad 122C, the first bottom substrate signal via 140A, and a portion of the bottom substrate bottom signal line 137. The first top substrate signal line 116D is again electrically connected to the third top substrate signal via 124C. The third top substrate signal via 124C is again electrically connected to the circular top substrate bottom metallization via pad 122C.

The first signal line 310 again comprises, taken in sequence from left to right, the second signal line 154B, the first top substrate signal via 124A, the first top substrate bottom signal line 122B, the second top substrate signal via 124B, the first top substrate top signal line 116D, the third top substrate signal via 124C, the circular top substrate bottom metallization via pad 122C, the first bottom substrate signal via 140A, the bottom substrate bottom signal line 137, the second bottom substrate bottom signal via 140B, the second top substrate bottom signal line 122D, the fourth top substrate signal via 124D, and finally the second port signal metal pad 156B.

The RF crossover 300 again comprises a first signal line 310. The RF crossover 300 again further comprises the second signal line 320. The top substrate bottom metallization (item 122 in FIGS. 1A, 1C, and 1D) and the bottom substrate top metallization (item 135 in FIGS. 1A, 1D, and 1F-1H) again together form the ground plane 122-135 configured to provide isolation to allow the first signal line 310 to traverse one or more of the top substrate 112 and the bottom substrate 126 without being disturbed by the second signal line 320.

The first signal line 310 again comprises, in the part that is pertinent for the description of this figure, the first top substrate top signal line 116D running along the top substrate top surface 114, the third top substrate signal via 124C, the circular top substrate bottom metallization via pad 122C, the first bottom substrate signal via 140A, the bottom substrate bottom signal line 137, the second bottom substrate bottom signal via 140B, and finally, the second top substrate bottom signal line 122D.

The first top substrate top signal line 116D is again located on the first signal line first level 340. The first signal line first level 340 again comprises the top substrate top surface 114.

The first signal line 310 again successively passes through the third top substrate signal via 124C, the circular top substrate bottom metallization via pad 122C, the first bottom substrate signal via 140A, and then the bottom substrate bottom signal line 137, which is located on the bottom substrate bottom surface 128. The first signal line second level 350 comprises one or more of the top substrate top surface 114, the bottom substrate bottom surface 128, and the ground plane 122-135. As depicted, the first signal line second level 350 comprises the bottom substrate bottom surface 128.

With the protection of the ground plane 122-135, the first signal line 310 again passes from the first signal line first level 340 to the first signal line second level 350 with the protection of the ground plane 122-135, thereby providing isolation from the second signal line 320.

Optionally, and as depicted, the second top substrate bottom signal line 122D is again located on a first signal line third level 360. The first signal line third level 360 again comprises the ground plane 122-135.

With the protection of the ground plane 122-135, the first signal line 310 again passes from the first signal line second level 350 to the first signal line third level 360 with the protection of the ground plane 122-135, thereby providing isolation from the second signal line 320.

With respect to the signal vias, 50-micron diameter metallized through-wafer vias connecting ground metallization on opposing surfaces on the substrate are used to form high-isolation electromagnetic via fences. Simulation has indicated that the vias can be used to provide high isolation up to 40 decibels (dB) at 20 GHz when spaced at a minimum pitch of 400 microns (μm). The via fence and the gold-plated silicon enclosure walls allow individual elements of two separated circuits to be effectively put into their own electromagnetically shielded cavities to minimize cross coupling. The through-wafer vias promote substantially continuous ground continuity for the RF return currents between the top and bottom covers and enables probe testing of the filter after fabrication. A further advantage of embodiments of the invention is that the "wall" formed by the gold-plated silicon enclosure walls and the via fence not only can be used to isolate channels, but also can be used to isolate individual elements. According to embodiments of the invention, electrical isolation between individual elements eliminates undesired cross-coupling seen in the prior art open-face printed designs and hence allows for rapid development and compact layout.

Another advantage provided by embodiments of the invention is that additional compaction is provided by replacement of a metal center web in a conventional H-frame with a conceptual 3-layer printed circuit board (PCB). Higher compaction is provided by embodiments of the invention due to one or more of condensed routing and higher component counts.

A still further advantage of embodiments of the invention is elimination of prior art feed-through transitions that require many intricate parts and complex assembly procedures while incurring risks of one or more of large manufacturing variation and field leakage. By sharp contrast, embodiments of the invention enable manufacture of both chips in a single manufacturing step.

Still further advantages of embodiments of the invention include that they enable design of RF transitions with intricate features at no additional cost for optimal performance on return loss and insertion loss, and in particular, nearly perfect isolation is provided to other regions under the same cover.

A further advantage provided by embodiments of the invention is that transitions at multiple locations can be formed at the same time in the substrate.

There are a few distinct advantages of the disclosed microelectronics H-frame device. The device offers hard substrates, which have much better-defined shapes than the prior art softer printed circuit board layers and the prior art low-temperature, co-fired ceramic (LTCC) layers, which are prone to shrinkage. Better-defined geometry implies better-controlled RF characteristics such as line impedance and loss, and hence more predictable RF performance.

A still further advantage of embodiments of the invention is that a size of the feed-through transition including the end walls and cut-out in the ground plane is about 30 mil for a stack of two 8-mil thick substrates, compared to a typical dimension of approximately 102 mil for a prior art traditional machined H-frame housing. A further advantage of embodiments of the invention is providing more than tenfold savings in transition area. Yet another advantage provided by embodiments of the invention is providing the feed-through transitions without a requirement of creating additional parts or adding additional manufacturing steps needed to make them. A major differentiator between embodiments of the invention and traditional prior art machined H-frame devices is that embodiments of the invention provide compact, no-cost vertical feed-through.

An additional advantage of embodiments of the invention is providing three-dimensional field channelization and isolation. Embodiments of the invention allow circuit elements to be placed in close proximity but with a wall in-between that eliminates any potential coupling, and hence results in a more compact layout. Therefore another advantage of embodiments of the invention is circuit layout compaction.

Embodiments of the invention offer high precision in patterning the metallization. A representative line width error for embodiments of the invention is approximately 1 micron, in comparison to prior art technologies that have typical line width errors that is typically at least ten times higher.

The disclosed new method for constructing electronics modules and the new electronic device facilitate a reduction of an order of magnitude in size, weight, and power (SWAP). The disclosed new method and new device also provides built-in RF integrity for high quality RF products.

Described is a drastically different electronics device system with deep compaction, microelectronics precision, and unprecedented RF routing flexibility and manufacturing repeatability.

Another advantage of embodiments of the invention is the versatility of transmission line styles that is available. The disclosed microelectronics H-frame device allows RF transmission lines to be built using one or more of a microstrip, a coplanar waveguide (CPW), and a stripline. This flexibility allows a designer to choose appropriate line types at different areas for optimal RF performance.

For embodiments of the H-frame device comprising more than two substrates, H-frame functionality will be preserved. One or more of routing flexibility, routing density, and a capability to incorporate three-dimensional components will increase rapidly as the number of substrates used by the device increases.

A still further advantage of embodiments of the invention is that combining two wafers in a stack essentially collapses the center web with a typical thinness in the range of 40 to 160 mils in a traditional machined H-frame into a thin metal layer that could be of merely a few microns thick. The change from a finite thickness to a "zero" thickness center web eliminates the need for a traditional feed-through. More importantly, collapse of the center web changes the design paradigm to using planar technology where intricate features realized in patterned metallization for optimal RF performance are now possible at no additional cost.

Another advantage provided by embodiments of the invention is versatile vertical walls. The covers not only totally sealed the package for foreign object debris (FOD) prevention, but also provides vertical walls wherever needed. For instance, the vertical wall provides channelization of RF paths, de-moding a cavity for stability, and good isolation in a vertical transition design.

A vertical feed-through in the microelectronics H-frame (FIG. 2 below) comprises one or more of patterned metallization on the substrates, through-substrate vias, and vertical metal walls offered by the micro-machined covers. The transition is designed with intricate features at no additional cost for optimal performance on return loss and insertion loss, and in particular the nearly perfect isolation to other regions under the same cover.

A further advantage of embodiments of the invention is that a distance between the escape line and the spiral turns is increased from approximately 3 microns for a representative prior art air bridge to a wafer thickness of approximately 200 microns. The increased spacing reduces the capacitive coupling, thereby helping to reduce performance sensitivity to manufacturing variation.

While the above representative embodiments have been described with certain components in exemplary configurations, it will be understood by one of ordinary skill in the art that other representative embodiments can be implemented using different configurations and/or different components. For example, it will be understood by one of ordinary skill in the art that the order of certain steps and certain components can be altered without substantially impairing the functioning of the invention. It will be further understood by those of skill in the art that the number of variations of embodiments of the invention are virtually limitless. For example, the first RF trace can run at any non-zero angle relative to the second RF trace. For example, designation of the first signal and the second signal in the RF crossover is arbitrary and can be reversed without substantially affecting embodiments of the invention. For example, it can be the second signal trace that traverses one or more of the top substrate and the bottom substrate without being disturbed by the first signal traversing one or more of the top substrate and the bottom substrate at a non-zero angle relative to the second signal line, at least one of the first signal line and the second signal line passing to a second level with the protection of the ground plane, thereby providing isolation from the other signal line.

For example, a stack comprising more than two wafers could be used. For example, if three wafers are used, there will be four metal layers and four different RF transitions. For example, the respective designations of "top" and "bottom" are arbitrary. Such designations can be reversed or otherwise changed without substantially altering the invention. For example, instead of being plated onto a substrate, bonding bumps can be plated onto one or more of a top cover and a bottom cover.

The representative embodiments and disclosed subject matter, which have been described in detail herein, have been presented by way of example and illustration and not by way of limitation. It will be understood by those skilled in the art that various changes may be made in the form and details of the described embodiments resulting in equivalent embodiments that remain within the scope of the invention. It is intended, therefore, that the subject matter in the above description shall be interpreted as illustrative and shall not be interpreted in a limiting sense.

The invention claimed is:

1. A microelectronics high isolation H-frame device comprising a radio frequency (RF) crossover, comprising:
   a stack of two or more substrates, wherein the substrate stack comprises a top substrate and a bottom substrate, wherein at least one of the top substrate and the bottom substrate comprises at least one of a transmission line, a circuit board, a filter, a power splitter, a coupler, and another electronic component, wherein bonding of the top substrate to the bottom substrate creates an electrical connection between the top substrate and the bottom substrate, wherein a bottom surface of the top substrate comprises top substrate bottom metallization, and wherein a top surface of the bottom substrate comprises bottom substrate top metallization, wherein the top substrate bottom metallization and the bottom substrate top metallization form a ground plane configured to provide isolation to allow a first signal line to traverse one or more of the top substrate and the bottom substrate without being disturbed by a second signal line traversing one or more of the top substrate and the bottom substrate at a non-zero angle relative to the first signal line, at least one of the first signal line and the second signal line passing to a second level with the protection of the ground plane, thereby providing isolation from the other signal line.

2. The device of claim 1, wherein the at least one of the first signal line and the second signal line passes from the second level to a third level with the protection of the ground plane, thereby providing isolation from the other signal line.

3. The device of claim 1, wherein the first level comprises one or more of the top surface of the top substrate, the bottom surface of the bottom substrate, and the ground plane.

4. The device of claim 1, wherein the second level comprises one or more of the top surface of the top substrate, the bottom surface of the bottom substrate, and the ground plane.

5. The device of claim 2, wherein the third level comprises one or more of the top surface of the top substrate, the bottom surface of the bottom substrate, and the ground plane.

6. The device of claim 1, further comprising a grounding structure configured to ground the device.

7. The device of claim 6, wherein the grounding structure comprises a substrate grounding structure.

8. The device of claim 7, wherein the substrate grounding structure comprises at least one of the top substrate top metallization, the bottom substrate bottom metallization, a top substrate bottom metallization, a bottom substrate top metallization, and through-substrate vias providing an electrical connection from the top substrate top metallization to the bottom substrate bottom metallization.

9. The device of claim 1, wherein the at least one of the first signal line and the second signal line passes to the second level through one or more of an escape transition, a crossover transition and a feed-through transition.

10. The device of claim 9, wherein the feed-through transition comprises a vertical feed-through transition.

11. The device of claim 2, wherein the at least one of the first signal line and the second signal line passes to the third level through a vertical feed-through transition.

12. The device of claim 11, wherein the feed-through transition comprises a vertical feed-through transition.

13. The device of claim 1, wherein the bottom substrate further comprises a plurality of bottom substrate signal vias, the bottom substrate signal vias configured to provide high isolation while conducting an electronic signal from the bottom substrate top metallization to the bottom substrate bottom metallization.

14. The device of claim 1, wherein the top substrate further comprises a plurality of top substrate signal vias, the top substrate signal vias configured to provide high isolation while conducting an electronic signal from the top substrate bottom metallization to the top substrate top metallization.

15. A microelectronics high isolation H-frame device comprising a radio frequency (RF) crossover, comprising:
a stack of two or more substrates, wherein the substrate stack comprises a top substrate and a bottom substrate, wherein at least one of the top substrate and the bottom substrate comprises at least one of a transmission line, a circuit board, a filter, a power splitter, a coupler, and another electronic component, wherein bonding of the top substrate to the bottom substrate creates an electrical connection between the top substrate and the bottom substrate, wherein a bottom surface of the top substrate comprises top substrate bottom metallization, and wherein a top surface of the bottom substrate comprises bottom substrate top metallization, wherein the top substrate bottom metallization and the bottom substrate top metallization form a ground plane configured to provide isolation to allow a first signal line to traverse one or more of the top substrate and the bottom substrate without being disturbed by a second signal line traversing one or more of the top substrate and the bottom substrate at a non-zero angle relative to the first signal line,
at least one of the first signal line and the second signal line passing to a second level with the protection of the ground plane, thereby providing isolation from the other signal line,
wherein the at least one of the first signal line and the second signal line passes from the second level to a third level with the protection of the ground plane, thereby providing isolation from the other signal line,
the device further comprising a grounding structure configured to ground the device, wherein the grounding structure comprises a substrate grounding structure, wherein the substrate grounding structure comprises at least one of the top substrate top metallization, the bottom substrate bottom metallization, a top substrate bottom metallization, a bottom substrate top metallization, and through-substrate vias providing an electrical connection from the top substrate top metallization to the bottom substrate bottom metallization.

* * * * *